United States Patent
Yamazaki et al.

(10) Patent No.: US 8,023,042 B2
(45) Date of Patent: Sep. 20, 2011

(54) SEMICONDUCTOR DEVICE AND METHOD OF MANUFACTURING THEREFOR

(75) Inventors: Shunpei Yamazaki, Tokyo (JP); Satoshi Murakami, Kanagawa (JP); Jun Koyama, Kanagawa (JP); Yukio Tanaka, Kanagawa (JP); Hidehito Kitakado, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1244 days.

(21) Appl. No.: 10/913,415

(22) Filed: Aug. 9, 2004

(65) Prior Publication Data
US 2005/0007494 A1    Jan. 13, 2005

Related U.S. Application Data

(62) Division of application No. 09/502,675, filed on Feb. 11, 2000.

(30) Foreign Application Priority Data

Feb. 12, 1999 (JP) .................................. 11-033623

(51) Int. Cl.
*H01L 21/00* (2006.01)
(52) U.S. Cl. ........................................................ 348/552
(58) Field of Classification Search .................. None
See application file for complete search history.

(56) References Cited

U.S. PATENT DOCUMENTS

| | | | |
|---|---|---|---|
| 5,212,542 A * | 5/1993 | Okumura ...................... 257/369 |
| 5,247,190 A | 9/1993 | Friend et al. |
| 5,302,966 A | 4/1994 | Stewart |
| 5,323,042 A * | 6/1994 | Matsumoto ................... 257/350 |
| 5,399,502 A | 3/1995 | Friend et al. |
| 5,412,493 A * | 5/1995 | Kunii et al. ..................... 349/43 |
| 5,499,123 A | 3/1996 | Mikoshiba |
| 5,594,569 A | 1/1997 | Konuma et al. |

(Continued)

FOREIGN PATENT DOCUMENTS

JP    4-369271    12/1992

(Continued)

OTHER PUBLICATIONS

Shunpei Yamazaki et al., "Semiconductor Device and Fabrication Method Thereof" Filing Date: Jul. 5, 2000, Specifications and Drawings of U.S. Appl. No. 09/610,217.

(Continued)

*Primary Examiner* — Tammy Pham
(74) *Attorney, Agent, or Firm* — Nixon Peabody LLP; Jeffrey L. Costellia

(57) ABSTRACT

In an active matrix type liquid crystal display device, in which functional circuits such as a shift register circuit and a buffer circuit are incorporated on the same substrate, an optimal TFT structure is provided along with the aperture ratio of a pixel matrix circuit is increased. There is a structure in which an n-channel TFT, with a third impurity region which overlaps a gate electrode, is formed in a buffer circuit, etc., and an n-channel TFT, in which a fourth impurity region which does not overlap the gate electrode, is formed in a pixel matrix circuit. A storage capacitor formed in the pixel matrix circuit is formed by a light shielding film, a dielectric film formed on the light shielding film, and a pixel electrode. Al is especially used in the light shielding film, and the dielectric film is formed anodic oxidation process, using an Al oxide film.

68 Claims, 28 Drawing Sheets

U.S. PATENT DOCUMENTS

| | | | |
|---|---|---|---|
| 5,643,826 | A | 7/1997 | Ohtani et al. |
| 5,706,064 | A | 1/1998 | Fukunaga et al. |
| 5,712,495 | A | 1/1998 | Suzawa |
| 5,801,673 | A * | 9/1998 | Shimada et al. ............ 345/100 |
| 5,856,689 | A | 1/1999 | Suzawa |
| 5,917,563 | A | 6/1999 | Matsushima |
| 5,923,962 | A | 7/1999 | Ohtani et al. |
| 5,998,841 | A | 12/1999 | Suzawa |
| 6,127,210 | A | 10/2000 | Mimura et al. |
| 6,140,667 | A | 10/2000 | Yamazaki et al. |
| 6,141,066 | A | 10/2000 | Matsushima |
| 6,144,082 | A | 11/2000 | Yamazaki et al. |
| 6,160,271 | A | 12/2000 | Yamazaki et al. |
| 6,198,133 | B1 | 3/2001 | Yamazaki et al. |
| 6,201,281 | B1 | 3/2001 | Miyazaki et al. |
| 6,281,552 | B1 | 8/2001 | Kawasaki et al. |
| 6,306,694 | B1 | 10/2001 | Yamazaki et al. |
| 6,323,490 | B1 * | 11/2001 | Ikeda et al. ............ 250/370.09 |
| 6,355,942 | B1 | 3/2002 | Yamazaki et al. |
| 6,359,665 | B1 | 3/2002 | Matsushima |
| 6,388,291 | B1 | 5/2002 | Zhang et al. |
| 6,399,988 | B1 | 6/2002 | Yamazaki |
| 6,433,361 | B1 | 8/2002 | Zhang et al. |
| 6,507,069 | B1 | 1/2003 | Zhang et al. |
| 6,512,504 | B1 | 1/2003 | Yamauchi et al. |
| 6,524,895 | B2 | 2/2003 | Yamazaki et al. |
| 6,531,713 | B1 | 3/2003 | Yamazaki |
| 6,534,826 | B2 | 3/2003 | Yamazaki |
| 6,576,926 | B1 | 6/2003 | Yamazaki et al. |
| 6,608,324 | B1 | 8/2003 | Yamazaki et al. |
| 6,773,971 | B1 | 8/2004 | Zhang et al. |
| 6,806,932 | B2 | 10/2004 | Matsushita |
| 6,855,956 | B2 | 2/2005 | Yamazaki et al. |
| 6,906,383 | B1 | 6/2005 | Zhang et al. |
| 7,057,691 | B2 | 6/2006 | Matsusima |
| 7,183,614 | B2 | 2/2007 | Zhang et al. |
| 7,190,418 | B2 | 3/2007 | Matsusima |
| 7,635,895 | B2 | 12/2009 | Zhang et al. |
| 2005/0167672 | A1 | 8/2005 | Yamazaki et al. |
| 2010/0068860 | A1 | 3/2010 | Zhang et al. |

FOREIGN PATENT DOCUMENTS

| | | |
|---|---|---|
| JP | 5-102483 | 4/1993 |
| JP | 07-130652 | 5/1995 |
| JP | 08-032080 A | 2/1996 |
| JP | 09-171196 A | 6/1997 |
| JP | 10-92576 | 4/1998 |
| JP | 10-294280 A | 11/1998 |
| WO | WO 90/13148 | 11/1990 |

OTHER PUBLICATIONS

Shunpei Yamazaki et al., Semiconductor Device and Manufacturing Method Thereof Filing Date: Jul. 6, 2000, Specifications and Drawings of U.S. Appl. No. 09/610,753.

Shunpei Yamazaki, Semiconductor Device and Method Fabrication Thereof Filing Date: Dec. 23, 1999, Specifications and Drawings of U.S. Appl. No. 09/471,359.

Shunpei Yamazaki, "Semiconductor Device and Fabrication Method Thereof" Filing Date: Feb. 22, 2000, Specification and Drawings of U.S. Appl. No. 09/510,734.

Shunpei Yamazaki, "Method for Manufacturing an Electrooptical Device" Filing Date: Mar. 22, 2000, Specifications and Drawings for U.S. Appl. No. 09/533,175.

Shunpei Yamazaki, "Semiconductor Device and Method of Manufacturing the Same" Filing Date: Feb. 7, 2000, Specifications and Drawings for U.S. Appl. No. 09/498,646.

Hatano et al. "A Novel Self-aligned Gate-overlapped LDD poly-Si TFT with High Reliability and Performance", 1997, IEEE, IEDM, p. 523-526.

Herman Schenk et al., "Polymers for Light Emitting Diodes" EuroDisplay 99 Proceedings, pp. 33-37.

Furue et al., "Characteristics and Driving Scheme of Polymer-Stabilized Monostable FLCD Exhibiting Fast Response Time and High Contrast Ratio With Gray-Scale Capability," SID 98 Digest, pp. 782-785.

Yoshida et al., "A Full-Color Thresholdless Antiferroelectric LCD Exhibiting Wide Viewing Angle With Fast Response Time," SID 97 Digest, pp. 841-844.

Shimokawa et al., "Characterization of High-Efficiency Cast-Si Solar Cell Wafers by MBIC Measurement," Japanese Journal of Applied Physics, vol. 27, No. 5, May 1988, pp. 751-758.

Herman Schenk et al., "Polymers for Light Emitting Diodes" EuroDisplay 99 Proceedings of the 19th IDRC (International Display Research Conference Proceedings), pp. 33-37.

* cited by examiner

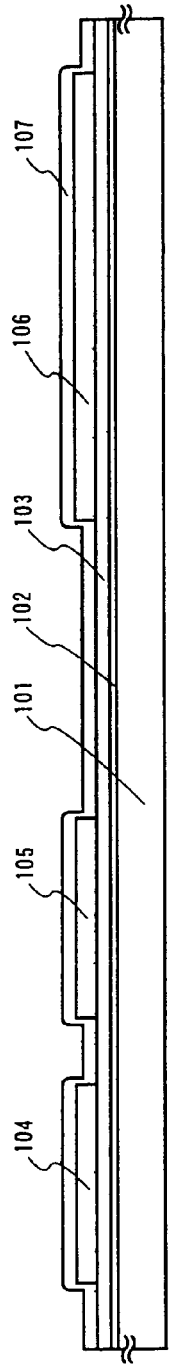
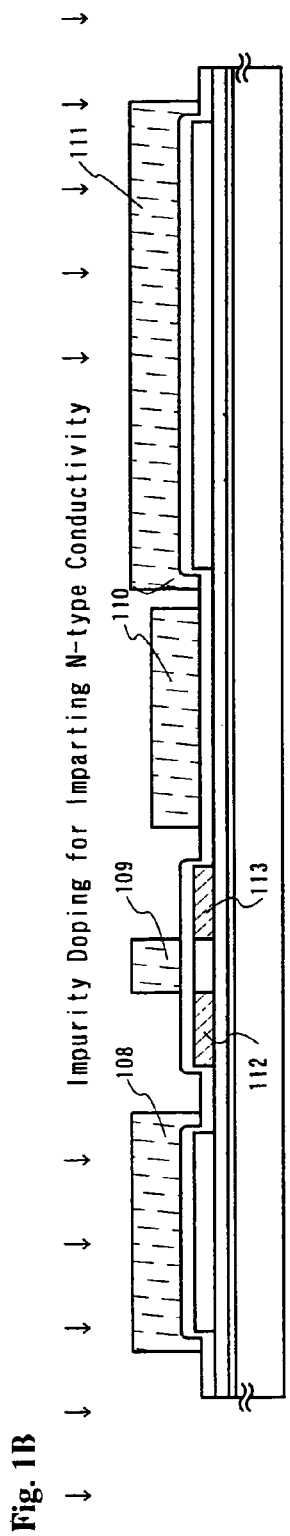
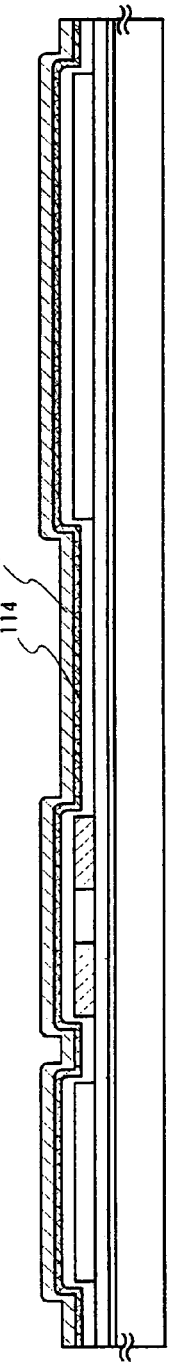

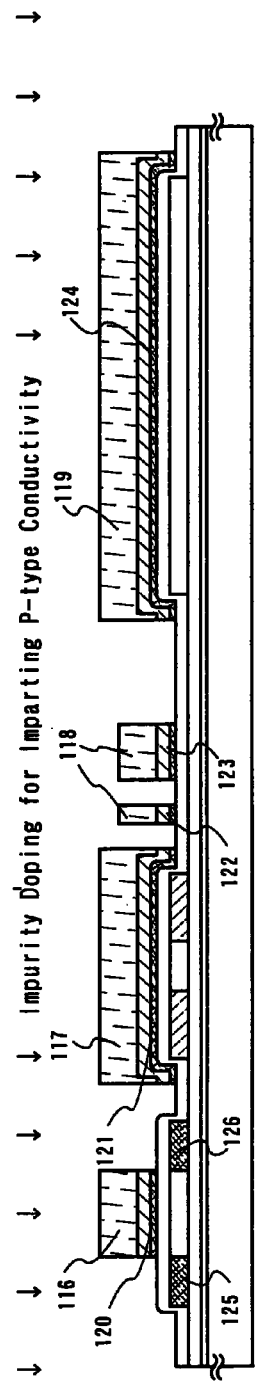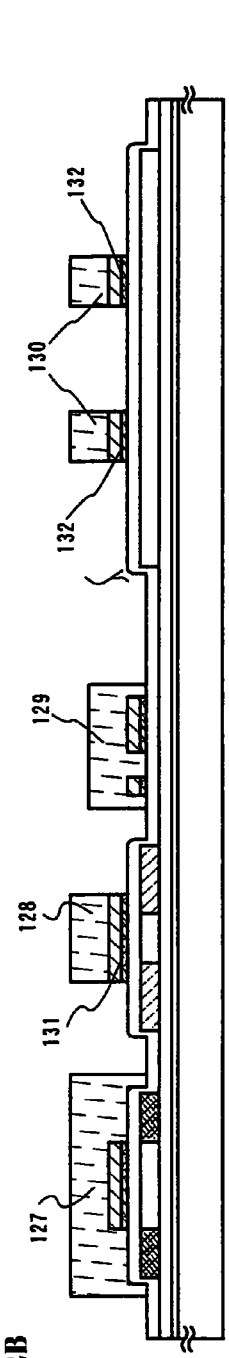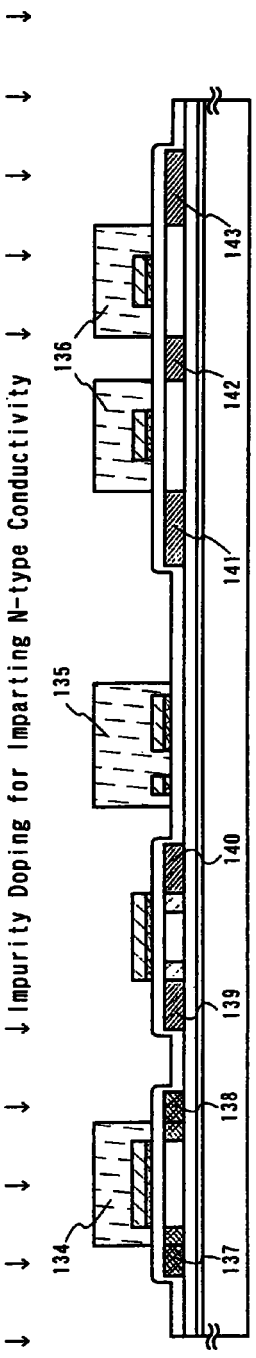

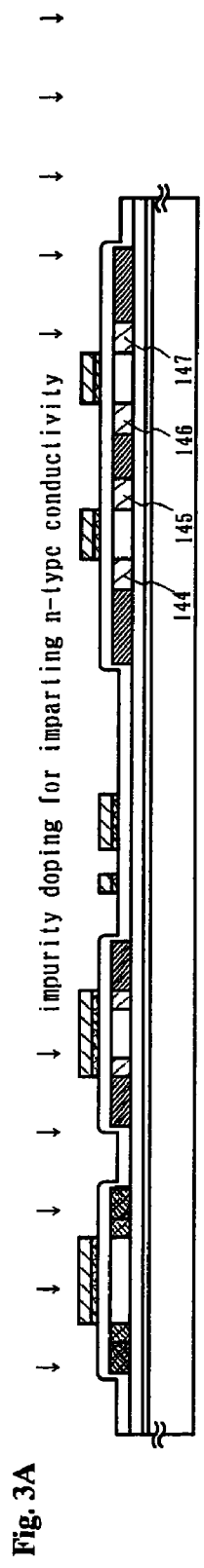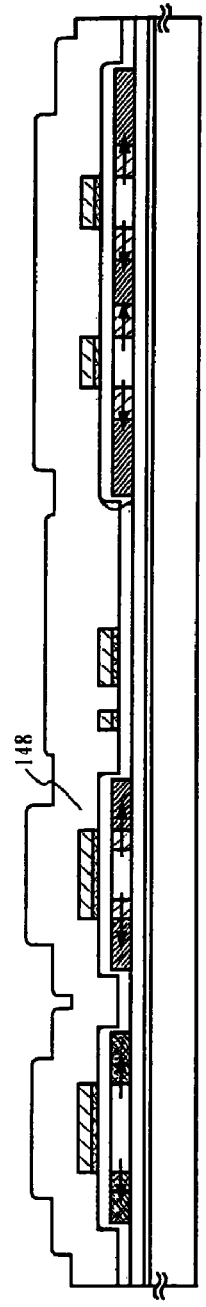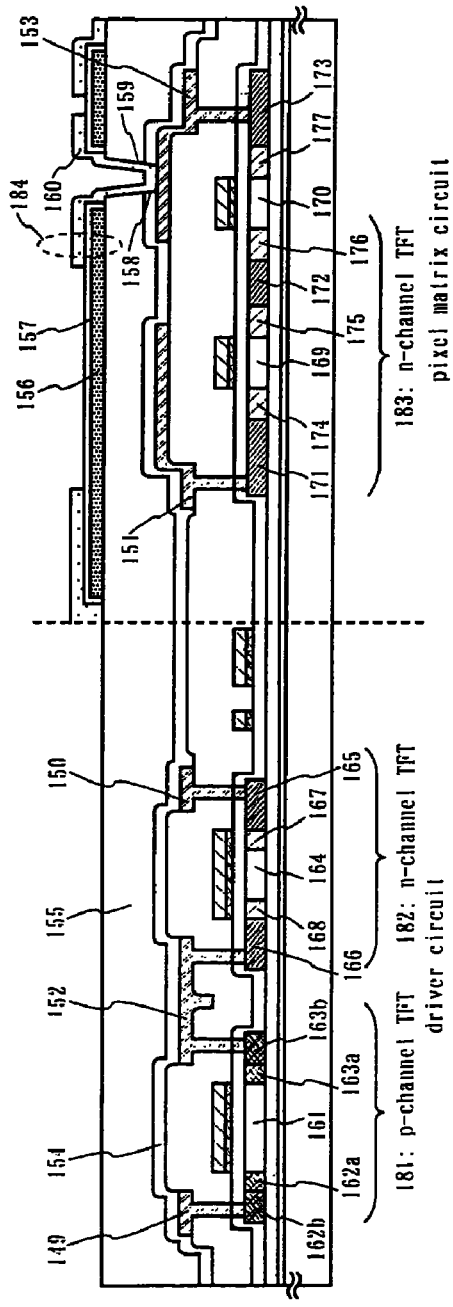

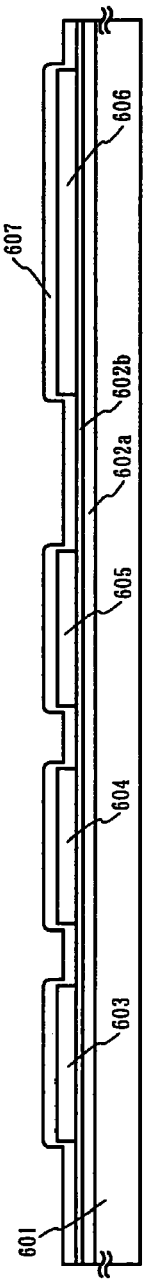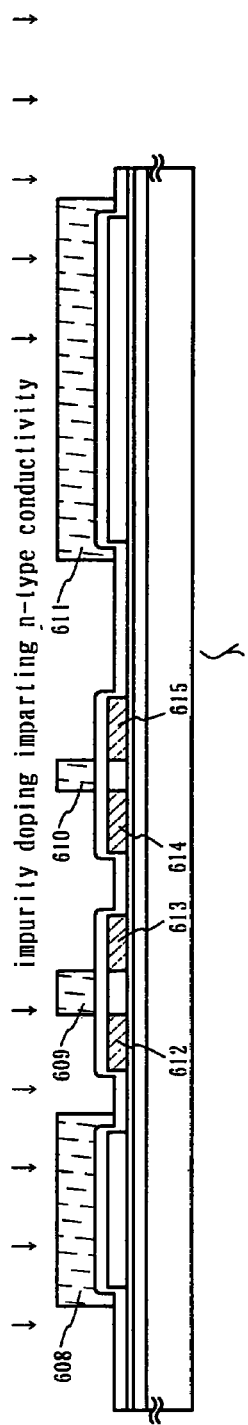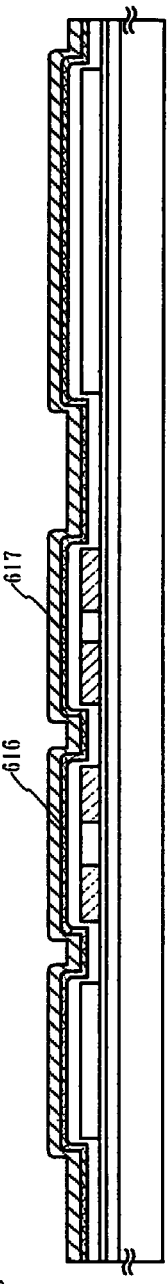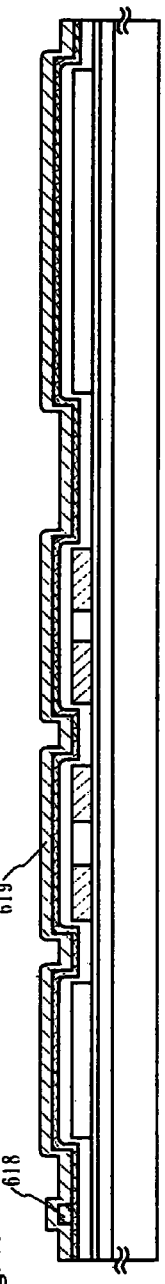
Fig. 6A
Fig. 6B
Fig. 6C
Fig. 6D

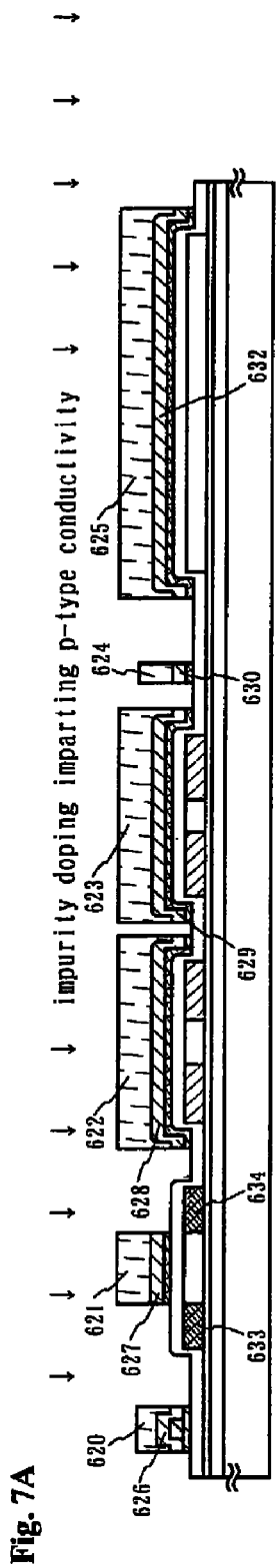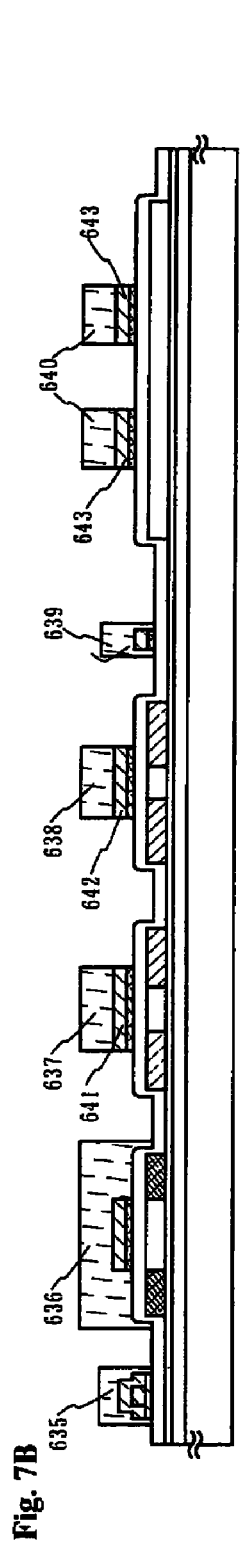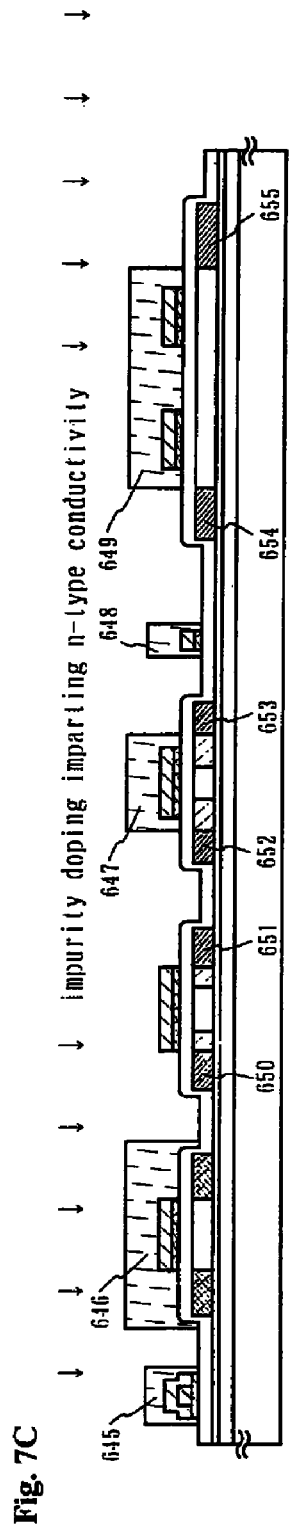

Ring Oscillator (R.O.) 19 stages, Lov=2μm, Loff=0μm, W=10μm
○: laser activation + heat treatment 450°C, 4 hours
□: 500°C, 4 hours
△: 550°C, 4 hours Ring Oscillator (R.O.) 19 stages, Li=6μm, Loff=0μm, W=10μm
○: laser activation + heat treatment 450°C, 4 hours
□: 500°C, 4 hours
△: 550°C, 4 hours

SEMICONDUCTOR DEVICE AND METHOD OF MANUFACTURING THEREFOR

BACKGROUND OF THE INVENTION

1. Field of the Invention

The present invention relates to a semiconductor device having a circuit comprising a thin film transistor on a substrate having an insulating surface, and a manufacturing method therefor. In particular, the present invention can ideally be used in electro-optical devices, typically liquid crystal display devices in which an active matrix circuit and a driver circuit formed on its periphery, are formed on the same substrate, and in electronic equipment loaded with an electro-optical device. Note that semiconductor device, in this specification, indicates general devices that function by using semiconductor characteristics. Note also that the above stated electro-optical devices, and electronic equipment loaded with the electro-optical device, are included in that category.

2. Description of the Related Art

The development of semiconductor devices having large surface area integrated circuits formed by thin film transistors (hereinafter referred to as TFTs) on a substrate having an insulating surface is advancing. Active matrix type liquid crystal display devices, EL display devices, and contact type image sensors are known as typical examples of such. TFTs are classified by their structure and their method of manufacture. In particular, the electric field effect mobility is high for TFTs (referred to as crystalline, TFTs) in which a semiconductor film having a crystal structure is made into an active layer, so that it is possible to form circuits with a variety of functions.

For example, a pixel section or pixel matrix circuit formed by n-channel TFTs, driver circuits such as a shift register circuit, a level shifter circuit, and a buffer circuit, based on CMOS circuits, and a sampling circuit are formed in each functional block on one substrate in an active matrix type liquid crystal display device. In addition, integrated circuits in a contact type image sensor, such as a sample hold circuit, a shift register circuit, and a multiplexer circuit, are formed using TFTs.

The characteristics of an electric field effect transistor such as a TFT can be considered to be divided into a linear region in which the drain current and the drain voltage increase proportionally, a saturation region in which the drain current is saturated even if the drain voltage increases, and a cut-off region in which ideally current does not flow even if there is an applied drain voltage. The linear region and the saturation region are called the ON region of a TFT, while the cut-off region is called the OFF region in this specification. In addition, for convenience the drain current in the ON region is called the ON current, and the current in the OFF region is called the OFF current.

The operating conditions of the respective circuits are not necessarily identical, so that naturally the characteristics required in the TFT also differ a great deal. In the pixel section, there is a structure formed by an n-channel TFT switching element and an auxiliary storage capacitor, and this is driven by applying a voltage to the liquid crystal. It is necessary to drive the liquid crystal by an alternating current here, and a system called frame inversion driving is employed. Therefore, a required TFT characteristic is the necessity to sufficiently reduce the leakage current. In addition, a high drive voltage is applied to the buffer circuit, so that it is necessary to increase the voltage resistance. Furthermore, it is necessary to sufficiently maintain the ON current in order to increase the current driver performance.

However, there is a problem in that the off current of the crystalline TFT is liable to become large. From the point of reliability, it is still believed that the crystalline TFT fall short of a MOS transistor (a transistor manufactured on a single crystal semiconductor substrate) used in LSIs, etc. For example, a deterioration phenomenon of a drop in the ON current in the crystalline TFT has been observed. The cause of this is the hot carrier effect, and it is thought that the hot carrier generated by the high electric field in the vicinity of the drain causes the degradation phenomenon.

A lightly doped drain (LDD) structure is known in a TFT structure. This structure is formed by a low concentration impurity region between a channel region, and a source region or drain region in which a high concentration of impurities is doped. This low concentration impurity region is called an LDD region. In addition, for the LDD structure, depending upon the positional relationship with the gate electrode, there is an LDD structure that overlaps the gate electrode (hereinafter, this LDD structure is referred to as GOLD (gate-drain overlapped LDD)), and an LDD structure that does not overlap the gate electrode. The high electric field is eased, the hot carrier effect is prevented, and the reliability can be increased with a GOLD structure. For example, there is a GOLD structure in which sidewalls are formed by silicon in Mutsuko Hatano, Hajime Akimoto and Takeshi Sakai, IEDM97 Technical Digest, pp. 523-6, 1997", and compared to TFTs with other structures, it has been confirmed that a very superior reliability can be obtained.

In addition, there is a TFT placed in each of from several tens to several millions of pixels in the pixel section of the active matrix type liquid crystal display device, and a pixel electrode is formed in each of the TFTs. Opposing electrodes are formed on the side of the opposing substrate sandwiching the liquid crystal, forming a kind of capacitor with the liquid crystal as a dielectric. The electric potential applied to each pixel is then controlled by the TFT switching function, and this becomes a structure in which the liquid crystals are driven by controlling the electric charge to the capacitors, controlling the amount of light transmitted and displaying an image.

The capacity of this capacitor gradually decreases due to the leak current, so that this causes the amount of transmitted light to change and the contrast of the image display to be reduced. Capacitor lines are formed conventionally, and a separate capacitor (a storage capacitor) is formed in parallel to the capacitor with the liquid crystal as its dielectric. The storage capacitor works to supplement the capacity lost by the capacitor with the liquid crystal as its dielectric.

However, the required characteristics are not necessarily the same for a TFT as a pixel section switching element and a driver circuit TFT such as a shift register circuit or a buffer circuit. For example, a large inverse bias voltage (negative for an n-channel TFT) is applied to the gate electrode in the pixel section TFT, but there is basically no operation in which an inverse bias voltage is applied to the driver circuit TFT. In addition, the operation speed of the former may be less than 1/100 that of the latter. Thus it is not preferable to use a similar structure for TFT in which the operating condition and required characteristics differ largely.

Furthermore, compared with an ordinary LDD structure, there is a problem with the GOLD structure in that the OFF current becomes large. In order to prevent an increase in the OFF current, it is possible to make a multi-gate structure in which a plural number of gates are formed between one source and drain pair, but that is insufficient for the GOLD structure TFT. Therefore, it is not necessarily preferable to form all of the TFTs of a large surface area integrated circuit with the same structure. For example, with the n-channel TFT constituting the pixel section, if the OFF current increases, then the power consumption increases and abnormalities in the image display appear, so that it is not desirable to apply the GOLD structure crystalline TFT as is. In addition, there is a problem with the LDD structure that has no overlap with the gate electrode in that the ON current decreases due to an increase in the series resistance. The ON current can be freely designed by the channel width, and for example, it is not always necessary to form the LDD structure that does not overlap the gate electrode, in a TFT constituting a buffer circuit.

In addition, if a storage capacitor using capacitor wirings in the pixel section is formed to maintain a sufficient capacity, then the aperture ratio must be sacrificed. In particular, for a small size high definition panel used in a projector type display device, the pixel area for each pixel is also small, so that the reduction in the aperture ratio due to the capacitor wiring becomes a problem.

SUMMARY OF THE INVENTION

The present invention is a technique for solving this type of problem, and an object of the invention is to realize a crystalline TFT in which reliability equivalent to, or greater than, that of a MOS transistor can be obtained. Another object of the present invention is to increase the reliability of a semiconductor device having a large surface area integrated circuit, in which various types of functional circuits are formed using this type of crystalline TFT. In addition, another object of the present invention is to increase the aperture ratio of an active matrix type liquid crystal display device, in relation to a pixel section TFT and the constitution of a storage capacitor.

In order to solve the above problems, according to one aspect of the present invention, there is provided a semiconductor device having a driver circuit and a pixel section on the same substrate, structured by thin film transistors, characterized in that, considering the operational characteristic required for the thin film transistors in each functional circuit, the driver circuit has: a first thin film transistor having a channel forming region, a third impurity region with one conductivity type forming a GOLD structure, and a first impurity region with one conductivity type forming a source region or a drain region formed on the outside of a gate electrode; a second thin film transistor having a channel forming region, a third impurity region with one conductivity type forming a GOLD structure, a second impurity region with one conductivity type forming an LDD structure formed on the outside of a gate electrode, and a first impurity region with one conductivity type forming a source region or a drain region; a third thin film transistor having a channel forming region, a second impurity region with one conductivity type forming an LDD structure formed on the outside of a gate electrode, and a first impurity region with one conductivity type forming a source region or a drain region; and a fifth thin film transistor having a channel forming region, and a fifth impurity region with the opposite conductivity to one conductivity type, forming a source region or a drain region, and the pixel section has: a fourth thin film transistor having a channel forming region, a fourth impurity region with one conductivity type forming an LDD structure formed on the outside of a gate electrode, and a first impurity region with one conductivity type forming a source region or a drain region.

In addition, another aspect of the present invention is characterized in that a storage capacitor formed in the pixel section is formed by a light shielding film on the fourth thin film transistor through an insulating layer; a dielectric film contacting the light shielding film and a pixel electrode connected to the fourth thin film transistor; and the pixel electrode contacting the dielectric film, and that the storage capacitor is connected to the fourth thin film transistor. The light shielding film is formed from a material with one or plural kinds of elements selected from aluminum, tantalum, and titanium as its main constituent, and it is preferable that the dielectric film be an oxide compound of the light shielding film material. In addition, the dielectric film may be formed from a material selected from silicon nitride, silicon oxide, oxidized silicon nitride, DLC, and polyimide.

In order to solve the above problems, a method of manufacturing a semiconductor device of the present invention is characterized by having: a step of forming plural island shape semiconductor layers on a substrate having an insulating surface; a step of forming a gate insulating film contacting the island shape semiconductor layers; a step of forming gate electrodes contacting the gate insulating film; a step of doping an impurity element with one conductivity type into selected regions of the island shape semiconductor layers, and of forming a first thin film transistor having a first impurity region, and a third impurity region overlapping the gate electrode; a step of doping an impurity element with one conductivity type into selected regions of the island shape semiconductor layers, and of forming a second thin film transistor having a first impurity region, a third impurity region that overlaps the gate electrode, and a second impurity region that does not overlap the gate electrode; a step of doping an impurity element with one conductivity type into selected regions of the island shape semiconductor layers, and of forming a third thin film transistor having a first impurity region, and a second impurity region that does not overlap the gate electrode; a step of doping an impurity element with the opposite conductivity type to one conductivity type into selected regions of the island shape semiconductor layers, and of forming a fifth thin film transistor having a fifth impurity region; and a step of doping an impurity element with one conductivity type into selected regions of the island shape semiconductor layers, and of forming a fourth thin film transistor having a first impurity region, and a fourth impurity region which does not overlap the gate electrode. The first thin film transistor through the fifth thin film transistor are formed on the same substrate, by the same steps, in consideration of the operational characteristics required by each thin film transistors for the various circuit functions.

In addition, according to another aspect of the present invention, it is preferable that a storage capacitor formed in the pixel section is formed by: a step of forming an insulating layer on the fourth thin film transistor; a step of forming a light shielding film on the insulating film; a step of forming a dielectric film contacting the light shielding film; and a step of forming a conductive film contacting the dielectric film. It is preferable that the step of forming the dielectric film contacting the light shielding film be an anodic oxidation process. Therefore, it is preferable that the light shielding film be formed by a material with one or plural kinds of elements selected from aluminum, tantalum, and titanium as its main constituent.

BRIEF DESCRIPTION OF THE DRAWINGS

In the accompanying drawings:

FIGS. 1A to 1C are cross sectional diagrams showing the manufacturing step of a pixel section and a peripheral driver circuit;

FIGS. 2A to 2C are cross sectional diagrams showing the manufacturing process of a pixel section and a peripheral driver circuit;

FIGS. 3A to 3C are cross sectional diagrams showing the manufacturing process of a pixel section and a peripheral driver circuit;

FIGS. 6A to 6D are cross sectional diagrams showing the manufacturing process of a pixel section and a peripheral driver circuit;

FIGS. 7A to 7C are cross sectional diagrams showing the manufacturing process of a pixel section and a peripheral driver circuit;

DETAILED DESCRIPTION OF THE PREFERRED EMBODIMENTS

Embodiment Mode 1

Figure 4:
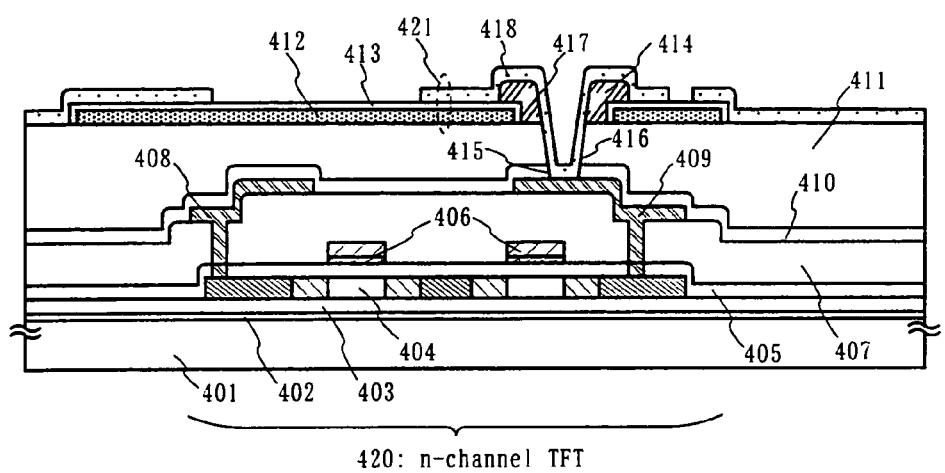
FIG. 4 is a cross sectional diagram showing the structure of a storage capacitor.

The embodiment modes of the present invention are explained using FIGS. 1A to 3C. A method of manufacturing a pixel section and driver circuit TFTs formed in the periphery at the same time is explained.

Process of Forming Island Shape Semiconductor Layers and Gate Insulating Films

It is preferable to use a non-alkaline glass substrate or a quartz substrate as a substrate 101 in FIG. 1A. In addition, a silicon substrate, and a metallic substrate on which an insulating film is formed on its surface may also be used. A base film 102 is then formed from a silicon oxide film, a silicon nitride film, or an oxidized silicon nitride film by plasma CVD or sputtering to a thickness of between 100 and 400 nm on the surface of the substrate 101 on which the TFTs will be formed. For example, a two layer structure may be used as the base film 102, with a silicon nitride film 102 from 25 to 100 nm, a thickness of 50 nm is used here, and a silicon oxide film 103 from 50 to 300 nm, a thickness of 150 nm is used here. The base film 102 is formed in order to prevent impurity contamination from the substrate, and does not necessarily need to be formed for the case of a quartz substrate being used. An amorphous silicon film is formed next, to a thickness of between 20 and 100 nm on the base film 102, by a known deposition method. Although it depends upon the amount of hydrogen contained in the amorphous silicon film, it is preferable to perform dehydrogenation by heat treatment at between 400 and 500° C. for several hours, and it is preferable to perform the crystallization process with the amount of included hydrogen below 5 atom. Furthermore, the amorphous silicon film may be formed by another manufacturing method such as sputtering or evaporation, but it is preferable to sufficiently reduce the impurity elements of oxygen and nitrogen included in the film. It is possible to form the base film and the amorphous silicon film by the same deposition method here, so that both may be formed in succession. It is possible to prevent contamination of the surface by not once exposing it to the atmosphere after forming the base film, and dispersion in the characteristics of the manufactured TFTs can be reduced. A known laser crystallization technique or thermal crystallization technique may be used for the process of forming a crystalline silicon film from the amorphous silicon film. Further, a crystalline silicon film may be manufactured by a method of thermal crystallization using a catalytic element to, promote crystallization of silicon. In addition, a microcrystalline silicon film may be used, and a crystalline silicon film may be directly deposited. Furthermore, a crystalline silicon film may be formed by using a known SOI (silicon on insulator) technique of adhering a single crystal silicon onto a substrate. The unneeded portions of the crystalline silicon film thus formed are removed by etching, forming island shape semiconductor layers 104 to 106. Boron (B) may be doped in advance to a concentration between $1\times10^{15}$ and $5\times10^{11}$ atoms/cm$^3$ in the regions of the crystalline silicon film where n-channel TFTs will be formed, in order to control the threshold voltage. A gate insulating film 107 is formed next, having silicon oxide, oxidized silicon nitride, or silicon nitride as its main constituent, covering the island shape semiconductor layers 104 to 106. The gate insulating film 107 may be formed to a thickness of between 10 and 200 nm, preferably from 50 to 150 nm. For example, an oxidized silicon nitride film may be formed to a thickness of 75 nm by plasma CVD with $N_2O$ and $SiH_4$ as the raw materials, and after that a 115 nm thick gate insulating film may be formed by thermal oxidation at between 800 and 1000° C. in a oxygen atmosphere or a mixed atmosphere of oxygen and chlorine. (See FIG. 1A.)

Formation of Second and Third Impurity Regions

In order to form low concentration impurity regions (denoted as a second impurity region and a third impurity region in this invention) that become LDD regions in the n-channel TFT of the CMOS circuit, masks 108 to 111 are formed from resist films over the entire surface of the island shape semiconductor layers 104 and 106, and over the channel forming region of the island shape semiconductor layer 105. A resist mask may be formed at this point in the region that will form peripheral wirings for the island shape semiconductor layers. An impurity element that imparts n-type conductivity is then doped, forming low concentration impurity regions. Phosphorous (P) is doped here by ion doping using phosphine (PH$_3$). Phosphorous is doped through the gate insulating film 107, into the semiconductor layers below, by this process. It is preferable that the concentration of doped phosphorous be in the range of between $1\times10^{16}$ and $1\times10^{19}$ atoms/cm$^3$, and is $1\times10^{18}$ atoms/cm$^3$ here. Thus low concentration impurity regions 112 and 113 are formed where phosphorous is doped in the island shape semiconductor layer 105. Heat treatment is performed afterward in a nitrogen atmosphere at between 400 and 900° C., preferable from 550 to 800° C., for 1 to 12 hours. A process of activating the doped n-type conductivity imparting impurity element is performed by this process. (See FIG. 1B.)

(Forming Conductive Films for the Gate Electrodes and the Wirings)

A first conductive film 114 is formed to a thickness of 10 to 100 nm from a conductive material with an element selected from tantalum (Ta), titanium (Ti), molybdenum (Mo), and tungsten (W) as its main constituent. It is preferable to use tantalum nitride (TaN) or tungsten nitride (WN) in the first conductive layer. In addition, although not shown in the figures, a silicon film may be formed below the first conductive film to a thickness of approximately 2 to 20 nm. Furthermore, a second conductive film 115 is formed on the first conductive film 114 to a thickness of 100 to 400 nm from a conductive material with an element selected from Ta, Ti, Mo, and W as its main constituent. For example, Ta may be formed to a 200 nm thickness. (See FIG. 1C.)

When using a Ta film as the second conductive film 115, it is possible to form it by sputtering. Ar gas is used as the sputtering gas for the Ta film. In addition, if an appropriate amount of Xe or Kr is added into the sputtering gas, then the internal stress of the formed film is relaxed and the film can be prevented from peeling. An α phase Ta film has a resistivity of approximately 20 μcm and can be used in a gate electrode, but a β phase Ta film has a resistivity of approximately 180 μcm and is unsuitable for use in a gate electrode. However, a TaN film possesses a crystal structure which is close to that of α phase, so that an α phase Ta film can easily be obtained provided that it is formed on top of a TaN film. Therefore, the first conductive film 114 may be formed of a TaN film with a thickness of between 10 and 50 nm. It is preferable that the resistivity of the Ta film be in the range of between 10 and 50 μcm.

When using a W film as the second conductive film, W is used as a target for sputtering, argon (Ar) gas and nitrogen (N$_2$) gas are introduced, and the first conductive film 114 is formed by a tungsten nitride (WN) film. The second conductive film 115 is formed of the W film by using sputtering with Ar gas. In addition, it is possible to form the W film by thermal CVD using tungsten hexafluoride (WF$_6$). Whichever is employed, in order to be used as a gate electrode there is a necessity to reduce the resistance, and it is preferable to make the resistivity of the W film below 20 μcm. By increasing the grain size of the W film a lowering of resistivity can be done, but in the case where there is a lot of impurity elements such as oxygen throughout the W film, crystallization is inhibited and it becomes high resistance. From this, when sputtering is employed, by forming the W film using a W target with 99.9999% purity, and in addition by providing sufficient forethought so that impurities are not mixed into the gas phase during deposition, a resistivity of between 9 and 20 μcm can be realized.

Forming the Gate Electrode (p-ch), Wiring Electrode, and Fifth Impurity Region

Resist masks 116 to 119 are formed, and a portion of the first conductive film and the second conductive film is removed by etching, forming a p-channel TFT gate electrode 120, and gate electrodes 122 and 123. An n-channel TFT gate electrode is formed by a later process, so the first conductive film and the second conductive film are left on the entire surface of the semiconductor layers 105 and 106. A process is then performed to dope an impurity element that imparts p-type conductivity into the portion of the semiconductor layer 104 on which the p-channel TFT is formed, with the resist masks 116 to 119 remaining as is as a mask. Boron is doped as the impurity element by ion doping using diborane (B$_2$H$_6$). Boron is doped to a concentration of $2\times10^{20}$ atoms/cm$^3$ here. Fifth impurity regions 125 and 126, doped with a high concentration of boron, are then formed as shown in FIG. 2A. In addition, the resist masks 116 to 119 may be used and a portion of the gate insulating film 107 is removed by etching in this process, and after exposing a portion of the island shape semiconductor layer 104, a process of doping an impurity element that imparts p-type conductivity may be performed.

Formation of Gate Electrode (n-ch)

Resist masks 127 to 130 are formed, and n-channel TFT gate electrodes 131 and 132 are formed. At this point the gate electrode 131 is formed so as to overlap with a portion of the low concentration impurity regions 112 and 113. (See FIG. 28.)

Formation of First Impurity Region

Resist masks 134 to 136 are formed, and a process of forming first impurity regions that function as a source region or a drain region in the n-channel TFT is performed. The resist mask 136 is formed in a shape that covers the n-channel TFT gate electrode 132. This is in order to form a fourth impurity region that becomes an offset LDD region in the n-channel TFT of the pixel section. An impurity element that imparts n-type conductivity is then doped, forming first impurity regions 139 to 143. An ion doping process is also performed here using phosphine (PH$_3$). It is preferable to make the phosphorous concentration in this region between $1\times10^{19}$ and $1\times10^{21}$ atoms/cm$^3$, and it is set at $1\times10^{20}$ atoms/cm$^3$ here. In addition, phosphorous is doped at the same time into a portion of the regions 125 and 126 of the island shape semiconductor layer 104, into which boron has been doped, forming regions 137 and 138. (See FIG. 2C.)

Formation of Fourth Impurity Region

A process of doping an impurity element that imparts n-type conductivity is performed in order to form a low concentration impurity region (denoted as fourth impurity region in this invention) that becomes an LDD region in the island shape semiconductor layer 106 of the pixel section n-channel TFT. It is preferable that the concentration of phosphorous doped be the same or lower than that of the second and third impurity regions, and it is set to $2\times10^{17}$ atoms/cm$^3$ here. Low concentration impurity regions 144 to 147 doped with phosphorous are then formed in the island shape semiconductor layers. (See FIG. 3A.)

Thermal Activation Process

A first interlayer insulating film 148 is formed on the entire surface of the gate insulating film and the gate electrodes (for cases when a portion of the island shape semiconductor layers 104 to 106 is exposed, on that upper surface as well). The first interlayer insulating film may be formed of a silicon nitride film, a silicon oxide film, or an oxidized silicon nitride film. In addition, a two-layer structure of a silicon nitride film with a silicon oxide film or an oxidized silicon nitride film may also be used (not shown in the figures). Whichever is used, the first interlayer insulating film may be formed so that its thickness is between 500 and 1000 nm. A heat treatment process is performed next in order to activate the impurity elements that impart n-type or p-type conductivity and have been doped at respective concentrations. This process can be performed by thermal annealing using an electric furnace or by rapid thermal annealing (RTA) using a halogen lamp. The activation process is performed by thermal annealing here. Heat treatment is performed in a nitrogen atmosphere at between 300 and 700° C., preferably from 350 to 550° C., and for example is performed at 525° C. for two hours. For cases in which the crystalline silicon film is manufactured by a thermal crystallization method using a catalytic element to promote crystallization of the silicon in the crystallization process of the semiconductor layer, a gettering effect in which the catalytic element is segregated in regions doped with phosphorous is obtained at the same time, and the catalytic element can be removed from the channel forming region. In addition, heat treatment is performed in an atmosphere containing between 3 and 100% hydrogen for 1 to 12 hours at between 300 and 450° C., performing a hydrogenation process of the island shape semiconductor layers. A plasma hydrogenation method may be used for this process, and heat treatment may be performed at between 200 and 450° C. in the hydrogen atmosphere generated by the plasma. (See FIG. 3B.)

Formation of Source and Drain Wiring, and Interlayer Insulating Film

Contact holes are next formed in the first interlayer insulating film 148 to reach the source region and the drain region of the respective TFTs. Source wirings 149, 150, and 151, and drain wirings 152 and 153 are then formed. Although not shown in the figures, a three layer structure of a 100 nm Ti film, a 300 nm Al film which includes Ti, and a 150 nm Ti film formed by successive sputtering is used in embodiment mode 1 for the electrodes. A passivation film 154 is then formed on the first interlayer insulating film, the source wirings, the drain wirings, and the respective wiring electrodes. The passivation film 154 is formed to a thickness of 50 to 500 nm by a silicon nitride film, a silicon oxide film, or an oxidized silicon nitride film. If a hydrogenation process is performed next in this state, then a desirable result can be obtained with regard to improving the TFT characteristics. For example, performing heat treatment at 300 to 450° C. for 1 to 12 hours in an atmosphere containing between 3 and 100% hydrogen is good, and a similar result can be obtained by using a plasma hydrogenation method or performing heat treatment at 200 to 450° C. in a hydrogen atmosphere generated by the plasma. Next, a second interlayer insulating film 155 is formed from an organic resin to approximately 1000 nm. Polyimide, acrylic, and polyimide amide can be used as the organic resin film. The following points can be given as the benefits of using an organic resin film: the ease of film deposition; the parasitic capacity can be reduced because the specific dielectric constant is low; and superior flatness. Note that organic resin films other than those stated above can also be used. A thermal polymerization type polyimide is used here, and after application to the substrate, it is formed through firing at 300° C.

Formation of Storage Capacitor and Pixel Electrode

A light shielding film 156 is formed on the second interlayer insulating film of the pixel section. The light shielding film 156 is a film with an element selected from aluminum (Al), titanium (Ti), and tantalum (Ta) as its main constituent, and is formed to a thickness of 100 to 300 nm. Then with the object of forming a storage capacitor in this section, a dielectric film 157 is formed on the light shielding film 156 with a thickness of between 50 and 200 nm. An oxidized film formed on the surface of the light shielding film 156 by using anodic oxidation may be used for the dielectric film 157. In addition, a silicon oxide film, a silicon nitride film, and an oxidized silicon nitride film, a DLC (diamond like carbon) film, and a polyimide film may also be used. However, the specific dielectric constant of polyimide is between 3 and 4 while the specific dielectric constant of Al oxide is between 7 and 9, for example, so that the latter is extremely suitable for the objective of forming a large capacity with a small surface area.

In concrete, an aluminum oxide is formed by anodic oxidation onto an aluminum film and an electrode of 0.785 mm$^2$ is formed thereon. As a result of measuring the capacitance, 110 pF at the aluminum oxide film thickness 50 nm and 630 pF at the aluminum oxide film thickness 100 nm were obtained. This capacitance value was 2-3 times as much in the case of forming polyimide in the same thickness. Although depending on the pixel size, the storage capacitor disposed in the pixel section of a liquid crystal display device require a capacitance of 100-300 pF. Formation of the storage capacitor by using an aluminum oxide film enabled the area of approximately ⅓ as that required to obtain the same capacitance in a case when polyimide was used.

A contact hole is then formed to reach the drain wiring 153 by an open section 159 formed in the second interlayer insulating film 155 and an open section 158 formed in the passivation film 154, and a pixel electrode 160 is formed. A transparent conductive film may be used for the pixel electrode 160 for the case of a transmission type liquid crystal display device, and a metallic film may be used for the case of a reflection type liquid crystal display device. A transmission type liquid crystal display device is taken here, so that an indium tin oxide (ITO) film is formed here by sputtering to a thickness of 100 nm. The pixel electrode 160 is formed extending through the dielectric film 157 to the light shielding film 156, and a storage capacitor 184 is formed in the region in which the pixel electrode 160 and the light shielding film 156 overlap. (See FIG. 3C.)

An active matrix substrate, in which an n-channel TFT 183 is formed in the pixel section, and a p-channel TFT 181 and an n-channel TFT 182 are formed on the same substrate in the surrounding driver circuit, is thus manufactured by the above processes.

A channel forming region 161, and fifth impurity regions 162 and 163, which function as a source or a drain region, are formed in the p-channel TFT 181 of the driver circuit. The fifth impurity region 162 is then made a source region, and the fifth impurity region 163 becomes a drain region. In addition, a channel forming region 164, and first impurity regions 165 and 166, and third impurity regions 167 and 168 that overlap with the gate electrode through the gate insulating film and function as LDD regions, are formed in the n-channel TFT 182. The first impurity region 165 functions as a source region, and the first impurity region 166 functions as a drain region.

Channel forming regions 169 and 170, first impurity regions 171, 172, and 173, which function as source or drain regions, and fourth impurity regions 174 to 177, which function as LDD regions and do not overlap the gate electrode through the gate insulating film, are formed in the n-channel TFT 183 of the pixel section.

By considering the operating environment of the respective n-channel TFTs of the pixel section and the driver circuit, and differing the length in the longitudinal direction of the channel of the second impurity regions, the third impurity regions, and the fourth impurity regions, which become LDD regions, on the same substrate, the present invention can build-in an optimal shape for the TFTs which structure the respective circuits. The n-channel TFT 182 is suitable for a logic circuit with a drive voltage of approximately 10 V. The length of the LDD region (the third impurity region) that overlaps the gate electrode ($L_{ov}$) may be made from 0.5 to 3.0 μm, typically 1.5 μm, for a channel length of between 3 and 7 μm. Further, the n-channel TFT 183 of the pixel section is a multi-gate structure, but in order to reverse its polarity and drive it, the fourth impurity regions 174 to 177 that become LDD regions, which do not overlap the gate electrode are formed on both the source side and the drain side. These regions may have a length ($L_{off}$) from 0.5 to 3.5 μm, typically 2.0 μm.

Thus as above, by optimizing the structure of the TFTs that constitute each circuit in response to the respective specifications of the pixel section and the driver circuits, the present invention can make it possible to raise the operating performance and the reliability of a semiconductor device. Specifically, by respectively differing the design of the LDD regions of the n-channel TFTs in response to each circuit specification, and by appropriately forming LDD regions that overlap the gate electrode, or LDD regions that do not overlap the gate electrode, a TFT structure that places great importance on a countermeasure against deterioration by hot carriers, and a TFT structure that places great importance on a low off current value, can be obtained.

Embodiment Mode 2

Another structure for the storage capacitor connected to the n-channel TFT of the pixel section of the active matrix substrate is explained. FIG. 4 shows a cross sectional structure diagram of the pixel section of the active matrix substrate manufactured similar to that of embodiment mode 1.

Base films 402 and 403 are formed on a substrate 401, and a first impurity region and a fourth impurity region are formed in an island shape semiconductor layer 404. A gate electrode 406 is formed on a gate insulating film 405, and a source wiring 408 and a drain wiring 409 are formed on a first interlayer insulating film 407. A light shielding film 412 and a pixel electrode 418 are then formed over a passivation film 410 and a second interlayer insulating film 411.

A storage capacitor 421 connected to an n-channel TFT 420 is formed from the light shielding film 412 formed on the second interlayer insulating film 411, a dielectric film 413 formed on that, and the pixel electrode 418. In addition, a spacer 414, an insulating body, is formed in the region that forms an opening in the second interlayer insulating film, and the pixel electrode 418 is connected to the drain wiring 409 by an opening 415 formed in the passivation film 410, by an opening 416 formed in the second interlayer insulating film 411, and by an opening 417 formed in the spacer 414. By thus forming the spacer 414, shorts can be prevented from being generated between the light shielding film and the pixel electrode. The storage capacitor 421 is formed in the portion in which the light shielding film 412, the dielectric film 413, and the pixel electrode 418 overlap.

Embodiment Mode 3

Figure 5A:
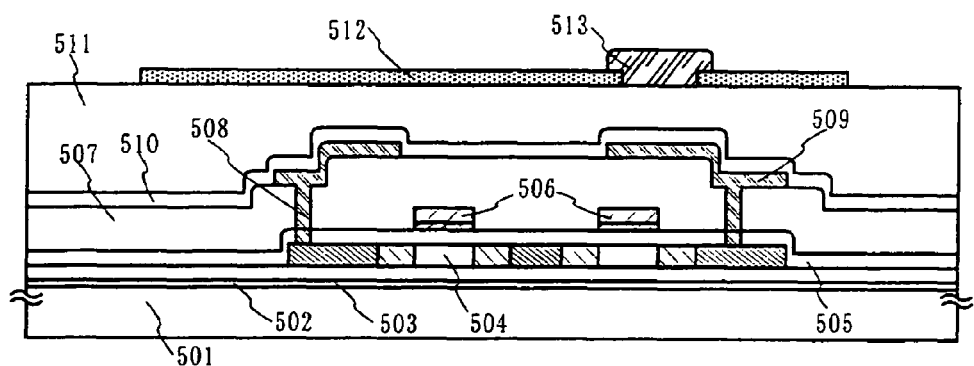
FIGS. 5A to 5C are cross sectional diagrams showing the manufacturing process of a storage capacitor.
Figure 5B:
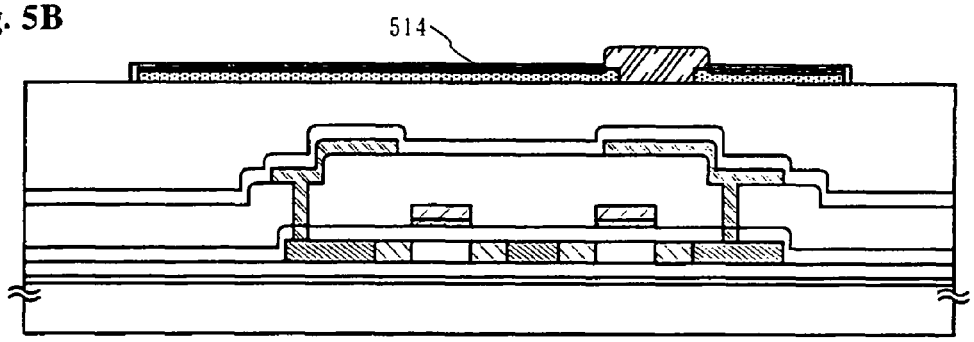
Figure 5C:
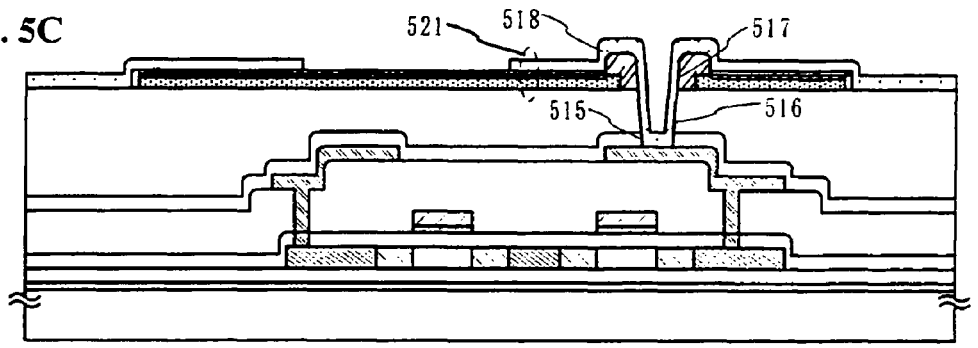
Figure 8A:
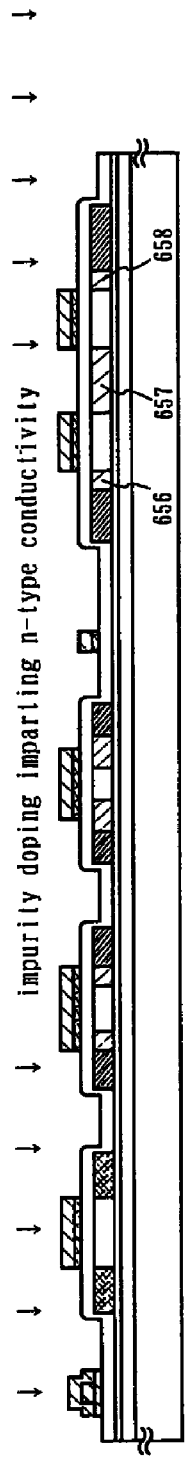
FIGS. 8A to 8C are cross sectional diagrams showing the manufacturing process of a pixel section and a peripheral driver circuit.
Figure 8B:
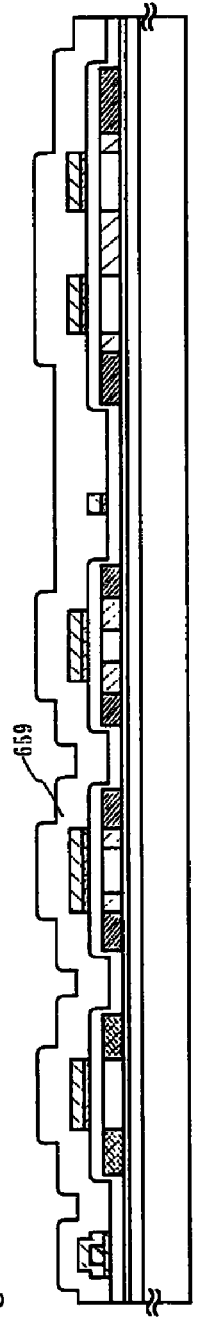
Figure 8C:
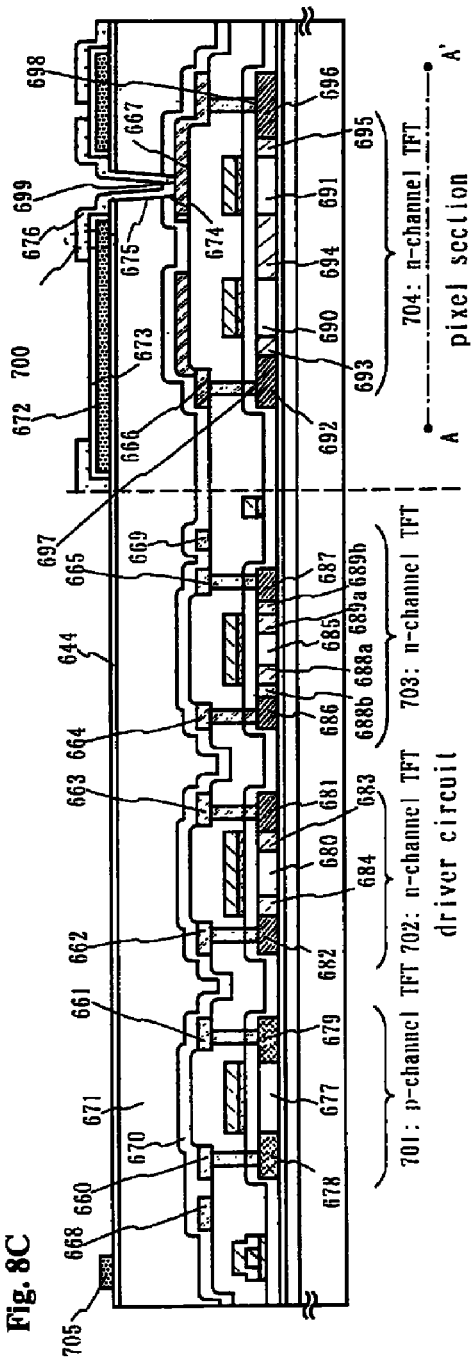

Another structure of a storage capacitor connected to the n-channel TFT of the pixel section is shown in FIGS. 5A to 5C. FIG. 5A is a pixel section n-channel TFT manufactured similar to that of embodiment mode 1. Base films 502 and 503 are formed on a substrate 501, and a first impurity region and a fourth impurity region are formed in an island shape semiconductor layer 504. A gate electrode 506 is formed on a gate insulating film 505, and a source wiring 508 and a drain wiring 509 are formed on a first interlayer insulating film 507. In addition, a light shielding film 512 and a spacer 513 formed by an organic resin are formed over a passivation film 510 and a second interlayer insulating film. A dielectric film 514 is next formed on the surface of the light shielding film by anodic oxidation, as shown in FIG. 5B. A pixel electrode 518 is connected to the drain wiring 509 by an opening 515 formed in the passivation film 510, by an opening 516 formed in a second interlayer insulating film 511, and by an opening 517 formed in the spacer 513, as shown in FIG. 5C. A storage capacitor 521 is formed in the portion in which the light shielding film 512, the dielectric film 514, and the pixel electrode 518 overlap. Thus shorts can be prevented from being generated between the light shielding film and the pixel electrode by forming the spacer 513, and further, the dielectric film 514 can be prevented from wrapping around the edge portions when being formed on the surface of the light shielding film 512.

Embodiment 1

A method of manufacturing a pixel section and its driver circuits on the same substrate is explained in embodiment 1 by refering FIGS. 6A to 8C. For convenience, this type of substrate is called an active matrix substrate in this specification. First, an oxidized silicon nitride film 602a is formed to a thickness of between 50 and 500 nm, typically 100 nm, on a substrate 601 as a base film. The oxidized silicon nitride film 602a is manufactured from $SiH_4$, $N_2O$, and $NH_3$, and the concentration of included nitrogen is set to greater than 25 atomic % and less than 50 atomic %. Heat treatment is performed next at 450 to 650° C. in a nitrogen atmosphere, making the oxidized silicon nitride film 602a more dense. Further, an oxidized silicon nitride film 602b is formed to a thickness of 100 to 500 nm, typically 200 nm, and a 20 to 80 nm thick amorphous semiconductor film (not shown in the figures) is formed in succession. A crystalline silicon film (not shown in the figures) is formed by a known crystallization method. Portions in which the crystalline silicon film is not necessary are removed by etching, forming island shape crystalline semiconductor films 603 to 606, and a gate insulating film 607 is further formed. The gate insulating film 607 is an oxidized silicon nitride film manufactured from $SiH_4$ and $N_2O$, and is formed to between 10 and 200 nm here, preferably from 50 to 150 nm. (See FIG. 6A.)

Resist masks 608 to 611 are next formed covering the entire surface of the island shape semiconductor layers 603 and 606, and covering the channel forming region of the island shape semiconductor layers 604 and 605. An impurity element that imparts n-type conductivity is then doped by ion doping using phosphine ($PH_3$), forming low impurity concentration-regions. Phosphorous is doped through the gate insulating film 607 to the island shape semiconductor layers below by this process, so that the acceleration voltage is set to 65 keV. It is preferable that the concentration of phosphorous doped into the island shape semiconductors be in the range of $1 \times 10^{16}$ to $1 \times 10^{19}$ atoms/cm$^3$, and is $1 \times 10^{18}$ atoms/cm$^3$ here. Regions 612 to 615 in which phosphorous is doped are thus formed. (See FIG. 6B.)

A first conductive film 616 is formed by means of sputtering from tantalum nitride (TaN) or tungsten nitride (WN). In addition, although not shown in the figures, a silicon film may be formed below the first conductive film to a thickness of 2 to 20 nm. A third conductive film 617, with a main constituent of aluminum (Al) or copper (Cu), is formed next to a thickness of between 100 and 300 nm. (See FIG. 6C.) In order to make the portion of the wiring from the input-output terminal to the input-output of the driver circuit, the third conductive film is then etched, forming a wiring 618. For example, if Al is used in the third conductive film, it can be etched by a phosphoric acid solution with good selectivity between base TaN film. Further, a second conductive film 619 is formed on the first conductive film 616 and the wiring 618 to a thickness of between 100 to 400 nm from a conductive material with its main constituent selected from Ta, Ti, Mo, and W. For example, Ta may be formed to a 200 nm thickness. (See FIG. 6d.)

Resist masks 620 to 625 are formed next, and a portion of the first conductive film and of the second conductive film are removed by etching, to thereby form a wiring 626 extending from the input-output terminal to the input-output of the driver circuit, a gate electrode 627 of the p-channel TFT, and a gate wiring 630. The etching of the TaN film and the Ta film can be performed with a mixtured gas of $CF_4$ and $O_2$. The resist masks 620 to 625 are then left as is, and a process of doping an impurity element that imparts p-type conductivity into the portion of the island shape semiconductor layer 603 on which the p-channel TFT is formed is performed. Boron is doped as the impurity element at this point by ion doping using diborane ($B_2H_6$). The boron concentration in this region is made $2\times10^{20}$ atoms/cm$^3$. Thus fifth impurity regions 633 and 634, doped with a high concentration of boron, are formed as shown in FIG. 7A.

The wiring 626 from the input-output terminal to the input-output of the driver circuit is formed so that the circumference of the third conductive layer is covered with the first conductive layer and the second conductive layer.

New resist masks 635 to 640 are formed after removing the resist masks formed in FIG. 7A. This is in order to form the n-channel TFT gate electrodes, and gate electrodes 641 to 643 of the n-channel TFTs are formed by dry etching. The gate electrodes 641 and 642 are formed at this point to overlap a portion of the low concentration impurity regions 612 to 615.

Thus the gate electrodes 627 and 641 to 643 are formed from the first conductive film and the second conductive film.

New resist masks 645 to 649 are then formed. The resist masks 647 and 649 are formed to cover the gate electrodes 642 and 643 of the n-channel TFTs and a portion of the second impurity region. A process of doping an impurity element that imparts n-type conductivity and forming first impurity regions is performed. First impurity regions 650 to 655 are formed in the island shape semiconductor layers forming the n-channel TFTs. (See FIG. 7C.)

A process of doping an impurity element that imparts n-type conductivity is performed in order to form a fourth impurity region of the pixel section n-channel TFT, which becomes an LDD region, in the island shape semiconductor layer 606. It is preferable that the doped phosphorous concentration be the same level as, or less than, that of the second and third impurity regions, and it is set to $2\times10^{17}$ atoms/cm$^3$ here. Fourth impurity regions 656 to 658 are formed in a self-aligning manner with the gate electrodes as a mask. (See FIG. 8A.)

A first interlayer insulating film 659 is then formed from an oxidized silicon nitride film by plasma CVD using $SiH_4$, $N_2O$, and $NH_3$ as raw materials. It is preferable to form this oxidized silicon nitride film so that it contains between 1 and 30 atomic % hydrogen. Heat treatment is next performed in this state in a nitrogen atmosphere at 400 to 800° C. for between 1 and 12 hours, for example at 525° C. for 8 hours. The doped impurity elements that impart n-type and p-type conductivities can be activated by this process. A hydrogenation process is performed after heat treatment. The hydrogenation process may be performed in a 3 to 100% hydrogen atmosphere at between 300 and 500° C., preferably from 350 to 450° C., for 2 to 12 hours. The hydrogenation process may be performed with hydrogen generated by the plasma at the substrate temperature between 200 and 500° C., preferably between 300 and 450° C. (See FIG. 8B.)

The first insulating film 659 forms a preset resist mask, and contact holes are formed through an etching process so that the contact holes reach the source regions and the drain regions of the respective TFTs. Source wirings 660, 663, 664, and 666, and drain wirings 661, 662, 665, and 657 are then formed. Although not shown in the figures, in embodiment 1 three layer structure electrodes formed by successively sputtering a 100 nm Ti film, a 300 nm Al film which contains Ti, and a 150 nm Ti film are used for these electrodes.

A passivation film 670 is then formed on top. The passivation film 670 may be an oxidized silicon nitride film formed from $SiH_4$, $N_2O$, and $NH_3$ by plasma CVD, or a silicon nitride film manufactured from $SiH_4$, $N_2$, and $NH_3$. A hydrogenation process is performed first, preceding the film formation, through plasma hydrogenation by introducing $N_2O$, $N_2$, $NH_3$, etc. The hydrogen generated in the gas phase by the plasma is supplied throughout the first interlayer insulating film, and provided that the substrate is heated to between 200 and 400° C., the hydrogen also diffuses to the lower layers and the semiconductor layers can be hydrogenated. There are no particular limits on the manufacturing conditions of the passivation film, but it is preferable that the film be dense. Further, a hydrogenation process may be performed after forming the passivation film by heat treatment in an atmosphere containing hydrogen or nitrogen for 1 to 12 hours at between 300 and 550° C.

A second interlayer insulating film 671 is formed next from an organic resin with a thickness of 1000 nm. Polyimide, acrylic, and polyimide amide can be used as the organic resin film. The following points can be given as the benefits of using an organic resin film: the ease of film deposition; the parasitic capacity can be reduced because the specific dielectric constant is low; and superior flatness. Note that organic resin films other than those stated above can also be used. A thermal polymerization type polyimide is used here, and after application to the substrate, it is formed by means of firing at 300° C.

If an insulating film 644 is formed on the second interlayer insulating film to a thickness of 5 to 50 nm from an oxidized silicon nitride film, silicon oxide film, etc., then the adhesion of a light shielding film formed on top of this can be raised. In addition, if the surface of the second interlayer insulating film, formed by an organic resin, is improved by processing with a $CF_4$ plasma, then the adhesion of films formed on top of this can be raised. An Al film is then formed by sputtering or vacuum evaporation and etched, forming a light shielding film 672. An oxide film of 50 to 200 nm formed on the surface of the light shielding film 672 is formed by anodic oxidation. In anodic oxidation, first a tartaric acid ethylene glycol solution with a sufficiently low alkaline ion concentration is prepared. The concentration of tartaric acid is between 0.1 and 10%, preferably 3%, and 1 to 20% ammonia in water is added to this, regulating the pH to 7±0.5. A platinum electrode that becomes a cathode is formed in this solution, and the substrate on which the light shielding film 672 is formed is immersed in the solution. A direct current is set so that it is fixed at 2 mA, with the light shielding film 672 as an anode. The voltage between the cathode and the anode in the solution changes with time in accordance with the growth of the oxide film, but the voltage is regulated so that the current is constant. When the voltage becomes 150 V, it is taken as fixed, and is maintained until the current is 0.1 mA. Thus an oxidized Al film 673 can be formed to a thickness of 50 to 200 nm on the surface of the light shielding film 672. Note that the values shown here related to the anodic oxidation method are only one example, and that the optimal values will naturally change with the size of the elements being manufactured, etc. A contact hole to reach the drain wiring 667 is then formed by the open sections formed in the insulating film 644, the second interlayer insulating film 671, and the passivation film 670, and a pixel electrode 676 is formed. A transparent conductive film may be used for the pixel electrode 676 for the case of a transmission type liquid crystal display device, and a metallic film may be used for the case of a reflection type liquid crystal display device. An indium tin oxide (ITO) film is formed to a thickness of 100 nm by sputtering because a transmission type liquid crystal display device is made here. The pixel electrode 676 is formed extending over the light shielding film 672 through the Al oxide film 673, and a storage capacitor 700 is formed in the region in which the pixel electrode 676 overlaps the light shielding film 672. Thus an active matrix substrate, in which a pixel section and driver circuit TFTs formed in the periphery are formed on the same substrate. (See FIG. 8C.)

A p-channel TFT 701 is formed in a self-aligning manner, and n-channel TFTs 702 to 704 are formed in a non-self-aligning manner. A channel forming region 677 and fifth impurity regions 678 and 679 are formed in the p-channel TFT 701 of the driver circuit. The fifth impurity region 678 becomes as a source region, and the fifth impurity region 679 becomes a drain region. On the other hand, a channel forming region 680, a first impurity region 681 that becomes a source region, a first impurity region 682 that becomes a drain region, and third impurity regions 683 and 684 that become LDD regions and overlap the gate electrode through the gate insulating film, are formed in the n-channel TFT 702. This n-channel TFT is suitable for a shift register circuit or a buffer circuit. In the ne-channel TFT 703, a channel forming region 685, a first impurity region 686 that becomes a source region, a first impurity region 687 that becomes a drain region, third impurity regions 688a and 689a that become LDD regions and overlap the gate electrode through the gate insulating film, and second impurity regions 688b and 689b that become LDD regions and do not overlap the gate electrode, are formed. This kind of n-channel TFT is suitable for a sampling circuit. Channel forming regions 690 and 691, first impurity regions 692 and 696, and fourth impurity regions 693 to 695 that become LDD regions and do not overlap the gate electrode through the gate insulating film, are formed in the n-channel TFT 704 of the pixel section.

Thus as above, by optimizing the structure of the TFTs that constitute each circuit in response to the respective specifications of the pixel section and the driver circuits, the present invention can make it possible to raise the operating performance and the reliability of a semiconductor device. For example, an LDD region (GOLD) is formed and which overlaps the gate electrode in the n-channel TFT 702 of the driver circuit. By forming this type of LDD region, fluctuation of properties due to the kink effect or the hot electron effect can be prevented, and this is suitable for a shift register, and especially for a buffer circuit. In the n-channel TFT 703, the LDD regions (GOLD) 688a and 689a are formed which overlap the gate electrode through the gate insulating film, while the LDD regions 688b and 689b are formed so as not to overlap the gate electrode, so that this is effective in the objective of reducing the off current value and preventing deterioration of the TFT due to the hot carrier effect. In the n-channel TFT of the pixel section, only LDD regions 693 to 695, which do not overlap the gate electrode, are formed, so it is effective in mainly reducing the off current value, making the switching operation reliable, along with reducing the power consumption.

Embodiment 2

Figure 9:
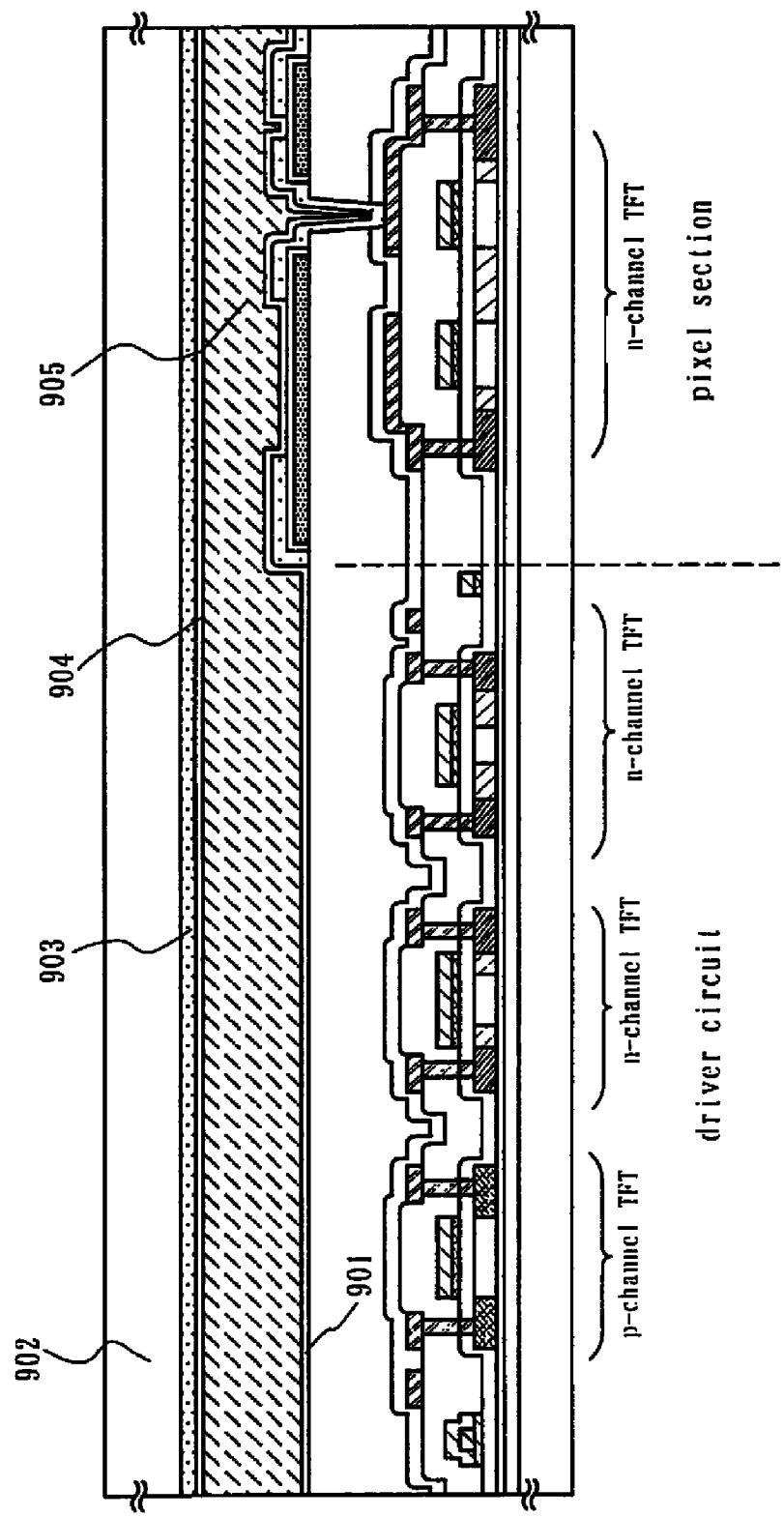
FIG. 9 is across sectional structure diagram of an active matrix type liquid crystal display device.

A process of manufacturing an active matrix type liquid crystal display device from an active matrix substrate is explained in embodiment 2. As, shown in FIG. 9, an alignment film 901 is formed to the state of FIG. 8C. Polyimide resin is often used in an alignment film of an ordinary liquid crystal display element. A transparent electrode 903 and an alignment film 904 are formed in an opposing side substrate 902. After formation, a rubbing process is performed to align the alignment films in parallel so that the liquid crystal molecules will possess a certain fixed pre-tilt angle. Then, the active matrix substrate on which the pixel section and the driver circuit are formed, and the opposing substrate are joined together through a sealing material or spacers (both not shown in the figures) in accordance with a known cell assembly process. A liquid crystal material 905 is next injected between both substrates, and this is completely sealed by a sealant (not shown in the figures). In addition to a TN liquid crystal, a thresholdless antiferroelectric liquid crystal, an antiferroelectric liquid crystal, etc., can be applied as the liquid crystal material. Thus the active matrix type liquid crystal display device shown in FIG. 9 is completed.

Figure 10:
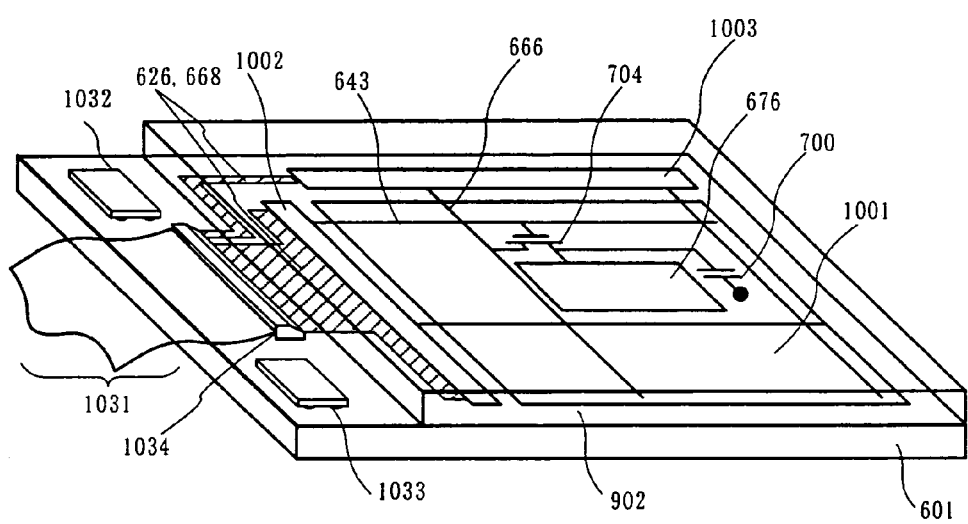
FIG. 10 is a perspective view of an active matrix type liquid crystal display device.
Figure 11A:
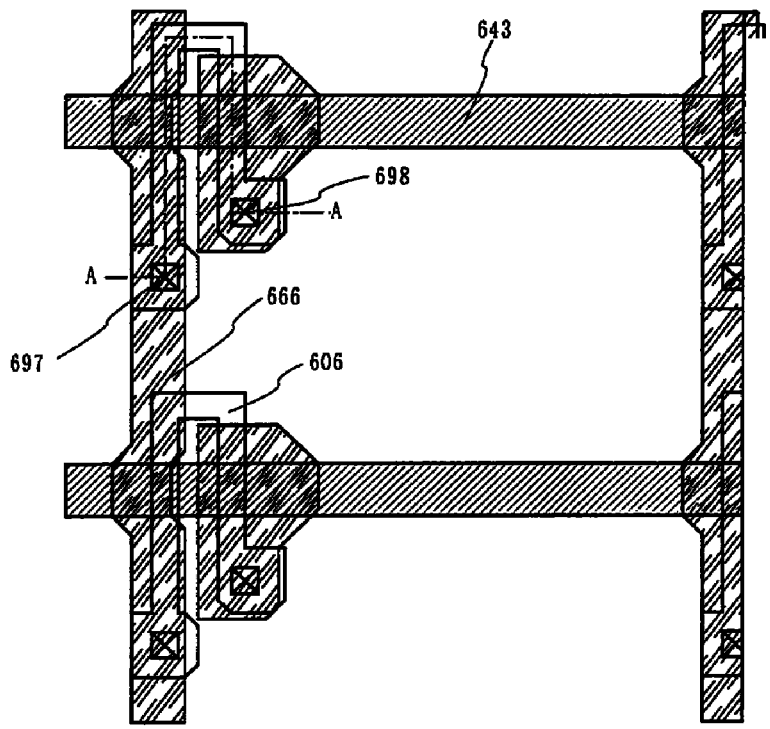
FIGS. 11A and 11B are top views of a pixel section.
Figure 11B:
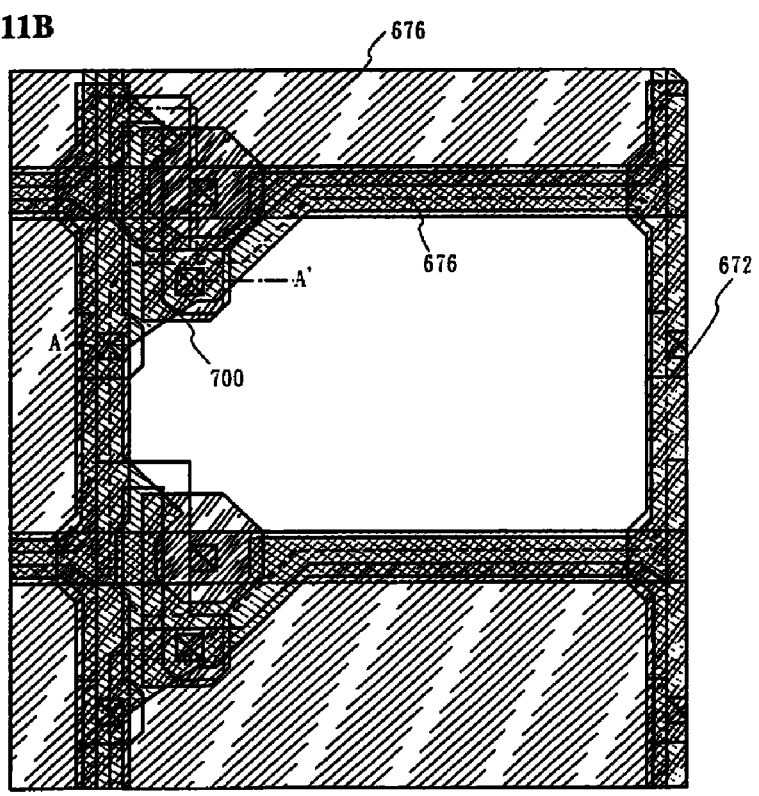

Next, the structure of this active matrix type liquid crystal display device is explained using the perspective view of FIG. 10 and the top views of FIGS. 11A and 11B. Note that in order to correspond with the cross sectional structure diagrams of FIGS. 6A to 8C, common reference numerals are also used in FIG. 10 and FIGS. 11A and 11B. The active matrix substrate is structured by a pixel section 1001, a scanning (gate) line driver circuit 1002, and a signal (source) line driver circuit 1003 formed on the glass substrate 601. The n-channel TFT 704 is formed in the pixel section, and the driver circuits formed in the periphery are basically structured with CMOS circuits. The scanning (gate) line driver circuit 1002 and the signal (source) line driver circuit 1003 are connected to the pixel section 1001 by the gate wiring 643 and the source wiring 666, respectively. In addition, the wirings 626 and 668 are formed from an external input-output terminal 1034, connected to an FPC 1031, to the input-output terminal of the driver circuits.

FIGS. 11A and 11B are top views showing a portion of the pixel section 1001. FIG. 11A is a top view showing a superposition of a semiconductor layer, a gate electrode, and a source wiring, and FIG. 11B is a top view showing the superposition of the light shielding films and the pixel electrodes formed on top. The gate electrode 643, through the gate insulating film (not shown in the figures), intersects the semiconductor layer 606 below. Although not shown in the figures, the source region, the drain region, and the fourth impurity region are formed in the semiconductor layer 606. In addition, the light shielding film 672, the dielectric film (not shown in the figures), and the pixel electrodes 676 formed for each pixel, are formed on the pixel TFTs, and the storage capacitor 700 is formed in the region where the light shielding film 672 and the pixel electrode 676 overlap through the dielectric film. It is possible to reduce the surface area to form a necessary capacitor by using a dielectric film formed in the capacitor section by oxidizing the surface of the Al film forming the light shielding film. Further, by making the light shielding film formed on the n-channel TFT of the pixel section into one electrode of the storage capacitor as in embodiment 2, the aperture ratio of the image display section of the active matrix type liquid crystal display device can be increased. Additionally, the cross sectional structure along the A-A' shown in FIGS. 11A and 11B corresponds to the cross sectional deagrams along the A-A' of the pixel section shown in FIGS. 8A to 8C.

Embodiment 3

Figure 12A:
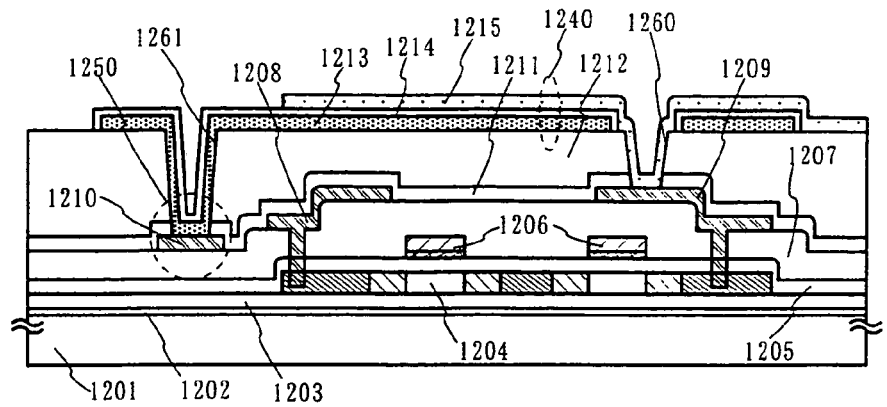
FIGS. 12A to 12C are cross sectional diagrams showing the structure of a storage capacitor.
Figure 12B:
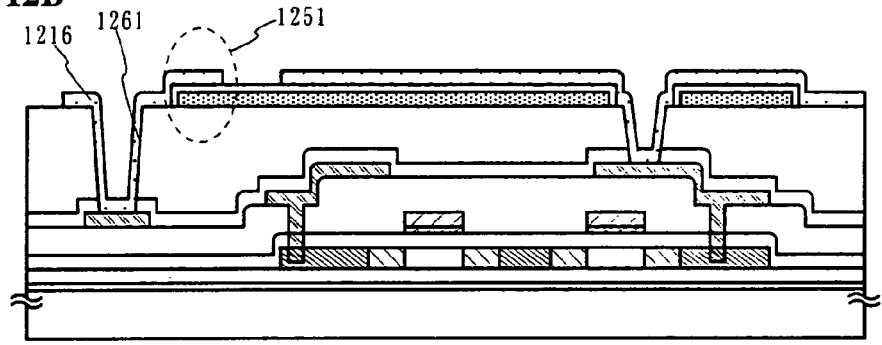
Figure 12C:
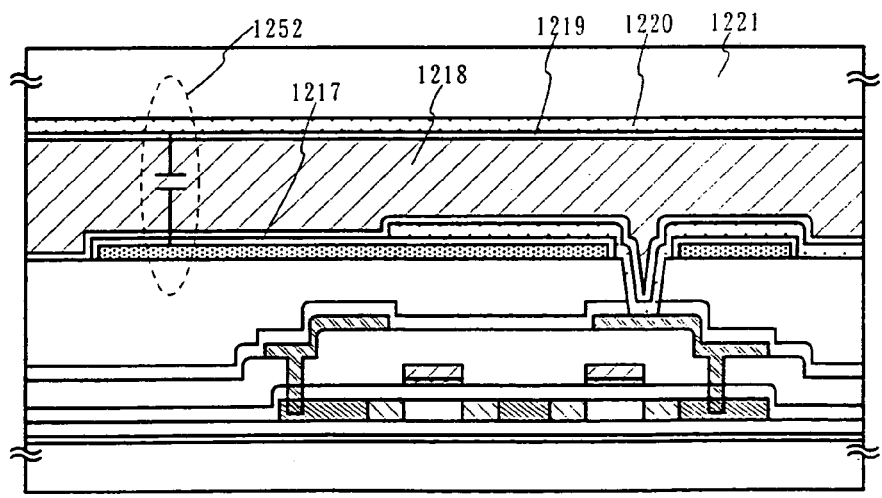

Another example is shown in FIGS. 12A to 12C of the constitution of the connection method for the storage capacitor formed in the pixel section TFT. FIGS. 12A to 12C show cross sectional structure diagrams of the pixel section of an active matrix substrate manufactured similar to that of embodiment mode 1. Base films 1202 and 1203 are formed on a substrate 1201, and a first impurity region and a fourth impurity region are formed in an island shape semiconductor layer 1204. A gate electrode 1206 is formed on a gate insulating film 1205, and a source wiring 1208 and a drain wiring 1209 are formed on a first interlayer insulating film 1207. In addition, a light shielding film 1213 is formed on a passivation film 1211 and a second interlayer insulating film 1212.

In FIG. 12A, a storage capacitor 1240 connected to an n-channel TFT is formed from the light shielding film 1213 formed on the second interlayer insulating film 1212, a dielectric film 1214 formed on that, and a pixel electrode 1215. The pixel electrode 1215, which is one of the storage capacitor 1240 electrodes, is connected to the drain wiring 1209 by an opening 1260 formed in the passivation film 1211 and the second interlayer insulating film 1212. In addition, the light shielding film, which is the other electrode, is connected to a wiring electrode 1210 formed on the first interlayer insulating film 1207 by an opening 1261 formed in the passivation film 1211 and the second interlayer insulating film 1212. Further, in FIG. 12B, it is possible to electrostatically combine a wiring 1216, formed from the same material as the pixel electrode 1215, and the light shielding film 1213 through the dielectric film 1214 by a connection section 1251, and it is possible to connect to the wiring electrode 1210 formed on the first interlayer insulating film 1207 by the opening 1261 formed in the passivation film 1211 and the second interlayer insulting film 1212. In addition, in FIG. 12B it is possible to electrostatically combine the light shielding film 1213 with a common electrode 1220, through the dielectric film 1214, the alignment film 1217, liquid crystal 1218, and an allignment film 1219 on the opposing substrate side.

Embodiment 4

Figure 13:
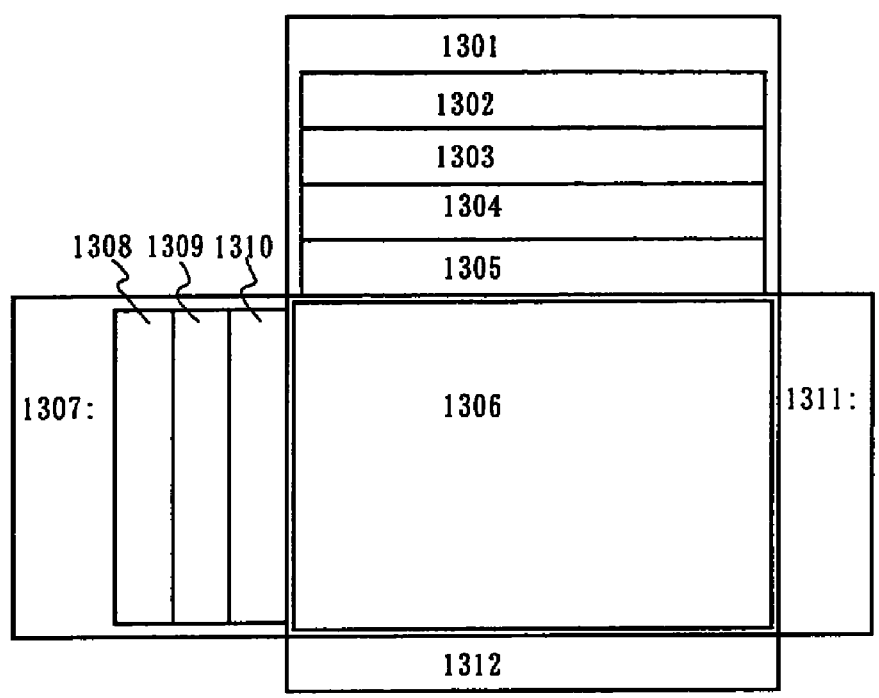
FIG. 13 is a circuit block diagram of an active matrix type liquid crystal display device.

FIG. 13 shows an example of the circuit structure of the active matrix substrate shown in embodiment 1. The active matrix substrate of embodiment 4 has a source signal line side driver circuit 1301, a gate signal line side driver circuit (A) 1307, a gate signal line side driver circuit (B) 1311, a precharge circuit 1312, and a pixel section 1306. The source signal line side driver circuit 1301 is provided with a shift register circuit 1302, a level shifter circuit 1303, a buffer circuit 1304, and a sampling circuit 1305. In addition, the gate signal line side driver circuit (A) 1307 is provided with a shift register circuit 1308, a level shifter circuit 1309, and a buffer circuit 1310. The gate signal line side driver circuit (B) 1311 has a similar structure.

To show one example of the driver voltages for the respective circuits here, it is between 10 and 16 V for the shift register circuits 1302 and 1308, while in the level shifter circuits 1303 and 1309, the buffer circuits 1304 and 1310, the sampling circuit 1305, and the pixel section 1306, the driver voltages are from 14 to 16 V. The amplitude of the voltage applied to the sampling circuit 1305 and the pixel section 1306 is a voltage in which the polarity is normally inverted, and mutually applied. Considering the n-channel TFT driver voltage, it is easy to differ the lengths of the second impurity regions that become LDD regions on the same substrate, and optimal shapes can be built-in for the TFTs that structure the respective circuits with the present invention.

Figure 14A:
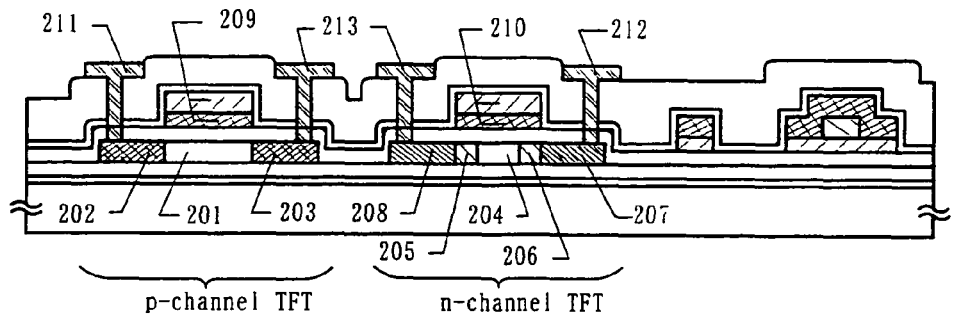
FIGS. 14A to 14D are cross sectional diagrams showing the structure of a TFT of the present invention.

FIG. 14A shows an example of the structure of a shift register circuit TFT. An n-channel TFT of the shift register circuit is a single gate, and third impurity regions (LDD regions) 205 and 206 are formed which overlap the gate electrode. The length of this region in the longitudinal direction of the channel may be made between 0.5 and 3 μm for a channel length of 3 to 7 μm. This LDD structure is effective as a countermeasure against hot carrier degradation, and is suitable for a shift register circuit in which the off region characteristics are not very important.

Figure 14B:
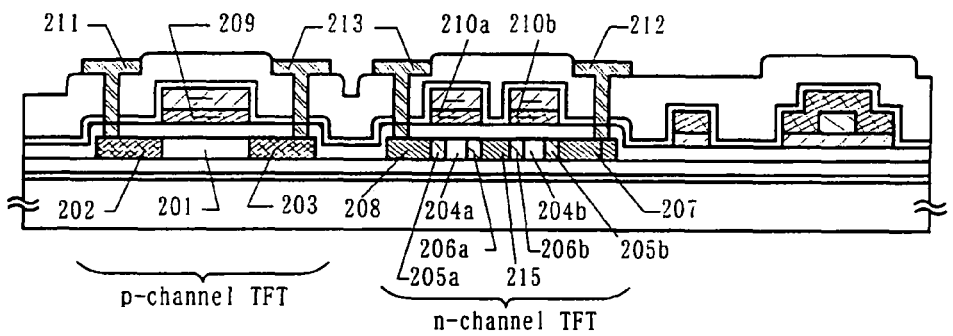

FIG. 14B shows an example of the structure of a level shifter circuit and a buffer circuit TFT. An n-channel TFT for these circuits has a double gate structure, but of course a single gate structure can also be used with no problem. This n-channel TFT also has a structure in which the third impurity regions (LDD regions) 205 and 206 are formed which overlap the gate electrode. By forming this type of LDD region, the high electric field region near the drain can be eased, and fluctuations of characteristics due to the kink effect and the hot electron effect can be prevented. As a result, the reliability of a buffer circuit can be increased.

Figure 14C:
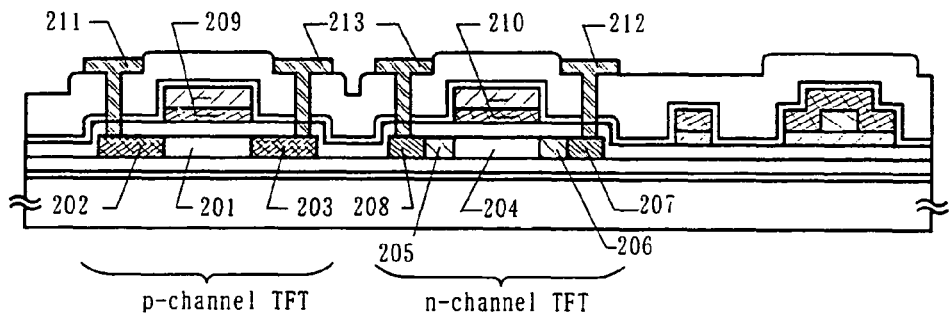

FIG. 14C shows an example of the structure of a sampling circuit TFT. The n-channel TFT of this circuit is a single gate, and second impurity regions that become LDD regions and overlap the gate electrode are formed on both the source side and the drain side. The length of the LDD regions 205 and 206 which do not overlap the gate electrode may be formed in the range of 0.5 to 3.0 μm, and both are preferably made of equal length. The objective of lowering the off current value, and the objective of preventing degradation of the TFT due to the hot carrier effect, can both be achieved at the same time by these LDD regions.

Figure 14D:
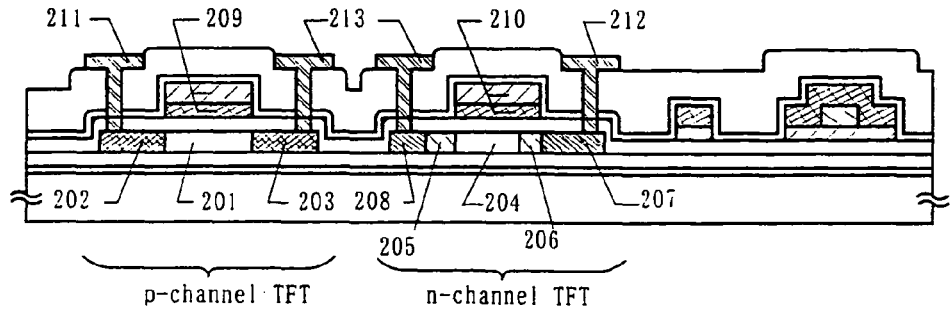

FIG. 14D is a structure suitable to a driver circuit operated at high speed by a driver voltage of approximately 1.5 to 5 V. Third impurity regions that overlap the gate electrode are not formed in a drain region 208 of the n-channel TFT, and this becomes a structure that prevents reduction of the operational frequency due to a parasitic capacity.

Embodiment 5

A method of manufacturing a semiconductor layer that can be applied to the present invention is explained in embodiment 5. A glass substrate, a ceramic substrate, a quartz substrate, etc., can be used as a substrate 1501 in FIGS. 15A to 15C. In addition, a silicon substrate with an insulating film such as a silicon oxide film or a silicon nitride film formed on the surface, and a metallic substrate, typically stainless steel, may also be used. When a glass substrate is used, it is desirable to heat it in advance at a temperature below the softening point. For example, if a Corning Co. #1737 substrate is used, it may be heat treated at 500 to 650° C., preferably between 595 and 645° C., for 1 to 24 hours.

A base film is then formed on the main surface of the substrate 1501. There are no special limitations on the base film material, but an oxidized silicon nitride film 1502 is formed. It is also possible to form this by a single layer or a plural number of layers selected from a silicon nitride film, a silicon oxide film, an oxidized silicon nitride film, and a tantalum oxide film. When an oxidized silicon nitride film is then used, it may be formed with a thickness of between 20 and 100 nm, typically 50 nm. In addition, an oxidized silicon nitride is formed to a thickness of 50-500 nm, typically 50-200 nm, on a silicon nitride film of 10-100 nm. An amorphous semiconductor layer 1503 is then formed on top. This may be any amorphous semiconductor formed by deposition by plasma CVD, reduced pressure CVD, sputtering, etc., and silicon (Si), germanium (Ge), a silicon and germanium alloy, silicon carbide are available, and in addition compound semiconductor materials such as gallium arsenide can be used. The semiconductor layer is formed between 10 and 100 nm in thickness, typically 50 nm. Furthermore, it is possible to form the base film 1501 and the amorphous semiconductor layer 1503 successively by plasma CVD or sputtering. By not exposing the surface to the atmosphere after forming the respective layers, the surface can be prevented from being contaminated. (See FIG. 15A.)

A crystallization process is performed next. A known laser crystallization technique or thermal crystallization technique may be used for the process of crystallizing the amorphous semiconductor layer. Furthermore, hydrogen is contained in the film at a ratio of 10 to 40 atomic % in an amorphous semiconductor layer formed by plasma CVD, and before performing crystallization, it is desirable to perform heat treatment at 400 to 500° C. and desorb the hydrogen from the film so that the amount of contained hydrogen is below 5 atomic %. (See FIG. 15B.) An island shape crystalline semiconductor layer 1505 is then formed from a crystalline semiconductor layer 1504, and a gate insulating film 1505 is formed. A material such as silicon nitride film, silicon oxide film, and oxidized silicon nitride film may be used in the gate insulating film 1505. The thickness of the gate insulating film 1505 may be formed between 10 and 1000 nm, preferably from 50 to 400 nm. If further processing is performed in accordance with embodiment 1, then the semiconductor device of the present invention can be formed. (See FIG. 15C.)

Figure 15A:
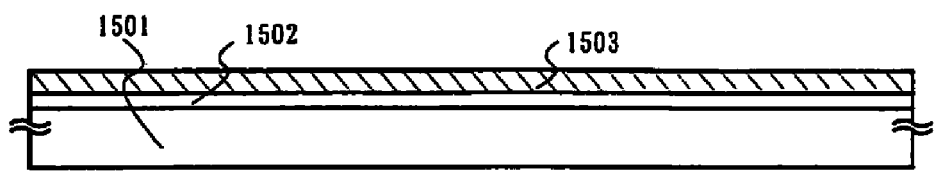
FIGS. 15A to 15C are cross sectional diagrams showing the manufacturing process of a crystalline semiconductor layer.
Figure 15B:
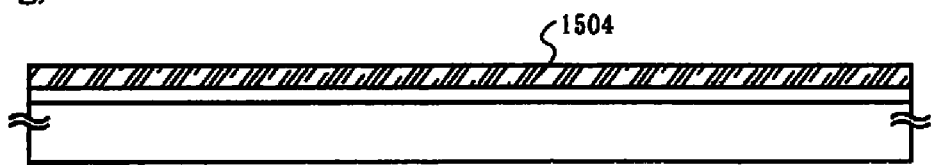
Figure 15C:
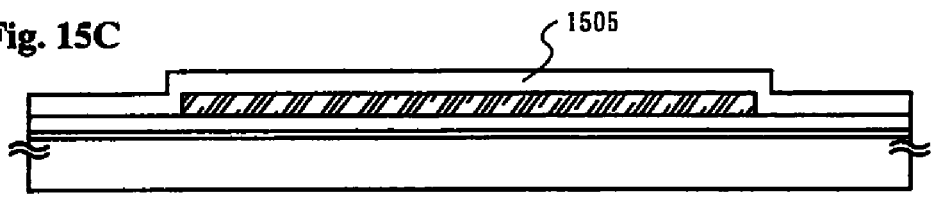
Figure 16A:
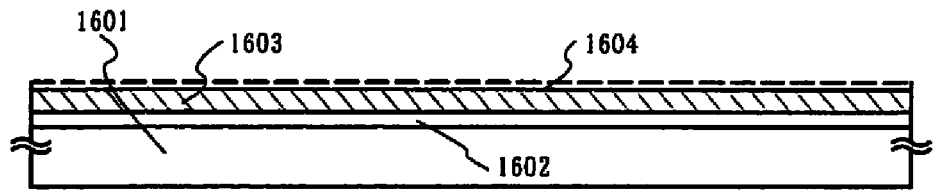
FIGS. 16A and 16E are cross sectional diagrams showing the manufacturing process of a crystalline semiconductor layer.
Figure 16B:
Figure 16C:
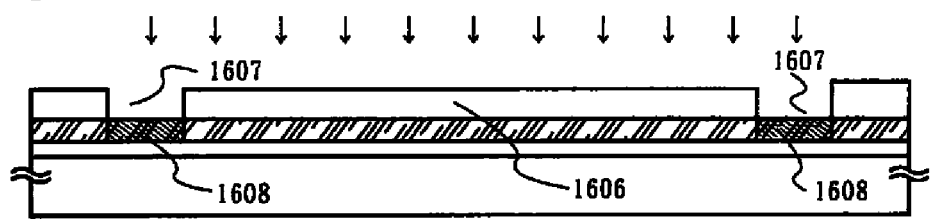
Figure 16D:
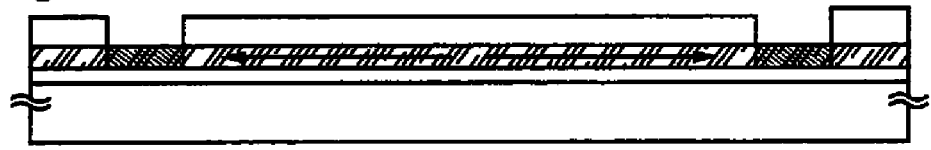
Figure 16E:
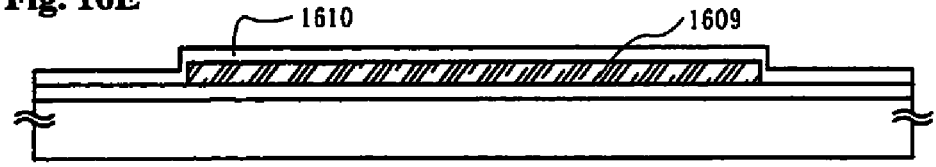
Figure 17A:
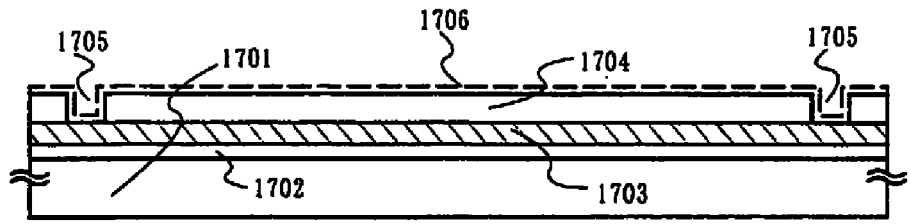
FIGS. 17A to 17E are cross sectional diagrams showing the manufacturing process of a crystalline semiconductor layer.
Figure 17B:
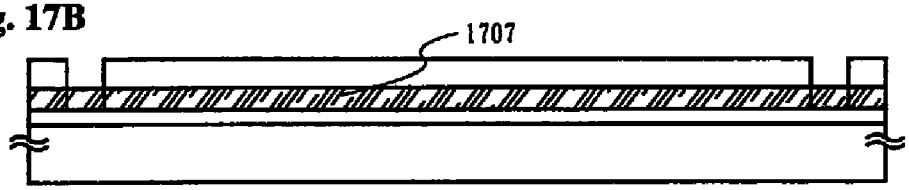
Figure 17C:
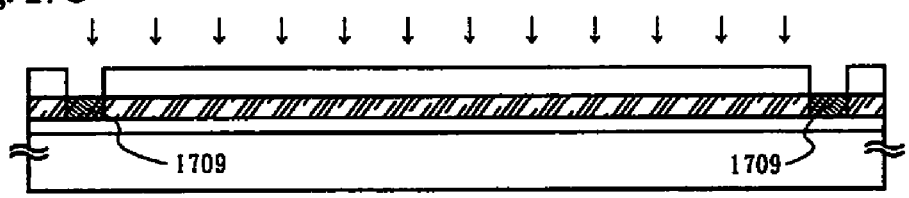
Figure 17D:
Figure 17E:
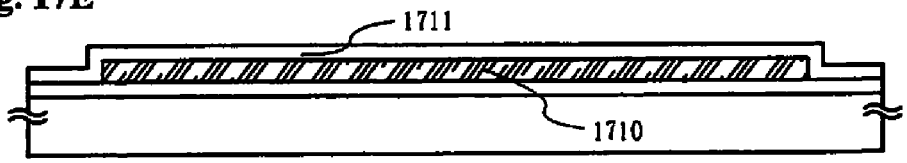

A base film 1602 is formed from an oxidized silicon nitride film on the main surface of a substrate 1601 in FIGS. 16A to 16E, and an amorphous semiconductor layer 1603 is formed on that surface similar to that of FIGS. 15A to 15C. The amorphous semiconductor layer may be formed with a thickness of between 10 and 200 nm, preferably from 30 to 100 nm. In addition, an aqueous solution containing 10 ppm by weight of a catalytic element is applied by spin coating, forming a catalytic element containing layer 1604 on the entire surface of the amorphous semiconductor layer 1603. In addition to nickel (Ni), the catalytic elements that can be used here are germanium (Ge), iron (Fe), palladium (Pd), tin (Sn), lead (Pb), cobalt (Co), platinum (Pt), copper (Cu), and gold (Au). The internal stress of the amorphous semiconductor layer is not uniformly determined by the manufacturing conditions. However, it is necessary to perform heat treatment at between 400 and 600° C., desorbing hydrogen from the film, before the crystallization process. (See FIG. 16A.) Heat treatment is then performed at 500 to 600° C. for 4 to 12 hours, for example at 550° C. for 8 hours, forming a crystalline semiconductor layer 1605. (See FIG. 16B.)

A gettering process to remove the catalytic element used in the crystallization process from the crystalline semiconductor film is performed next. The concentration of the catalytic element in the crystalline semiconductor film can be reduced below $1\times10^{17}$ atoms/cm$^3$, preferably below $1\times10^{16}$ atoms/cm$^3$ by this gettering process. A mask insulating film 1606 is first formed on the surface of the crystalline semiconductor layer 1605 to a thickness of 150 nm, and an open section 1607 is formed by patterning, forming an exposed region of the crystalline semiconductor layer. A phosphorous doping process is then performed, forming a phosphorous containing region 1608 in the crystalline semiconductor layer. (See FIG. 16C.) If heat treatment is performed in a nitrogen atmosphere at 550 to 800° C. for 5 to 24 hours in this state, for example at 600° C. for 12 hours, then the phosphorous containing region 1608 works as a gettering site, and the catalytic element remaining in the crystalline semiconductor layer 1605 can be segregated in the phosphorous containing region 1608. (See FIG. 16D.) By then removing the mask insulating film 1606 and the phosphorous containing region 1608 by etching, a crystalline semiconductor layer in which the concentration of the catalytic element used in the crystallization process is reduced to below $1\times10^{17}$ atoms/cm$^3$ can be obtained. A gate insulating film 1610 is then formed adhering to an island shape semiconductor layer 1609. (See FIG. 16E.)

On the other hand, a base film 1702 and an amorphous semiconductor layer 1703 are formed in order on a substrate 1701 in FIGS. 17A to 17E, and a mask insulating film 1704 is formed on the surface of the amorphous semiconductor layer 1703. The mask insulating film is made a 150 mm thick, in this case. Further, the mask insulating film 1704 is patterned, selectively forming an open section 1705, and an aqueous solution containing 10 ppm by weight of a catalytic element is applied next. Thus a catalytic element-containing layer 1706 is formed. The catalytic element-containing layer 1706 contacted the amorphous semiconductor layer 1703 only through the open section 1705. (See FIG. 17A.) Heat treatment is performed next at between 500 and 650° C. for 4 to 24 hours, for example at 570° C. for 14 hours, forming a crystalline semiconductor layer 1707. The region of the amorphous semiconductor layer contacting the catalytic element crystallizes first in this crystallization process, and then crystallization proceeds from there in the horizontal direction. The crystalline semiconductor layer 1707 thus formed has a gathering of cylindrical shape or needle shape crystals. Looking at each of the crystals macroscopically, they are grown with a specific directionality, so there is an advantage in that the crystals line up. (See FIG. 17B.)

A process is performed next to remove the catalytic element used in the crystallization process from the crystalline semiconductor film, similar to that of FIGS. 16A to 16E. A phosphorous doping process is performed on the substrate in the same state as in FIG. 17B, forming a phosphorous containing region 1709 in the crystalline semiconductor layer. The amount of contained phosphorous in this region is between $1\times10^{19}$ and $1\times10^{21}$ atoms/cm$^3$. (See FIG. 17C.) If heat treatment is performed in a nitrogen atmosphere at 550 to 800° C. for 5 to 24 hours in this state, for example at 600° C. for 12 hours, then the phosphorous containing region 1709 works as a gettering site, and the catalytic element remaining in the crystalline semiconductor layer 1707 can be segregated in the phosphorous containing region 1709. (See FIG. 17D.)

By then removing the mask insulating film 1704 and the phosphorous containing region 1709 by etching, an island shape crystalline semiconductor layer 1710 is formed. A gate insulating film 1711 is then formed adhering to the crystalline semiconductor layer 1710. The gate insulating film 1711 is formed from a single layer or a plural number of layers selected from silicon oxide and oxidized silicon nitride. It may be formed with a thickness of 10 to 100 nm, preferably from 50 to 80 nm. Heat treatment is then performed in an atmosphere containing a halogen (typically chlorine) and oxygen, for example, at 950° C. for 30 minutes. Note that it is good if the heat treatment temperature is selected in the range of 700 to 1100° C., and it is good if the processing time is selected between 10 minutes and 8 hours. As a result, a thermal oxidation film is formed at the interface of the island shape semiconductor layer 1710 and the gate insulating film 1711, and a good interface with a low interface level density can be formed. (See FIG. 17E.)

Embodiment 6

Semiconductor devices, in which an active matrix type display device is incorporated in accordance with the TFT circuits of the present invention, are explained by referring FIGS. 18A to 20D in embodiment 6.

The following can be given as examples of this type of semiconductor devices: portable information terminals (such electronic notebook mobile computers and portable telephones); video cameras; still cameras; personal computers; and televisions. Some examples of these are shown in FIGS. 18A to 18F.

Figure 18A:
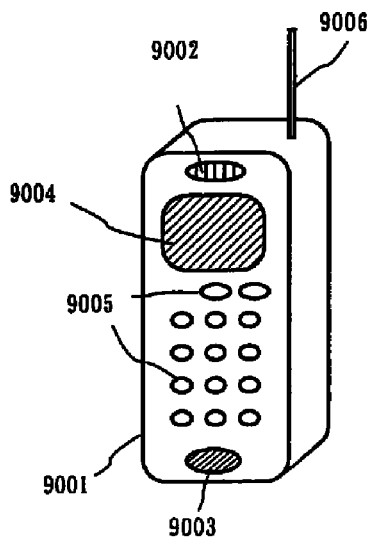
FIGS. 18A to 18F are diagrams showing examples of semiconductor devices.

FIG. 18A is a portable telephone, and is composed of a main body 9001, a voice output section 9002, a voice input section 9003, a display device 9004, operation switches 9005, and an antenna 9006. The present invention can be applied to the voice output section 9002, to the voice input section 9003, and to the display device 9004 provided with an active matrix substrate.

Figure 18B:
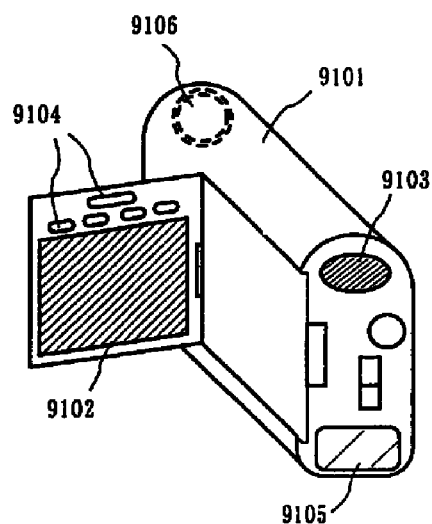

FIG. 18B is a video camera, and is composed of a main body 9101, a display device 9102, a voice input section 9103, operation switches 9104, a battery 9105, and an image receiving section 9106. The present invention can be applied to the voice input section 9103, and to the display device 9102 provided with an active matrix substrate, and to the image receiving section 9106.

Figure 18C:
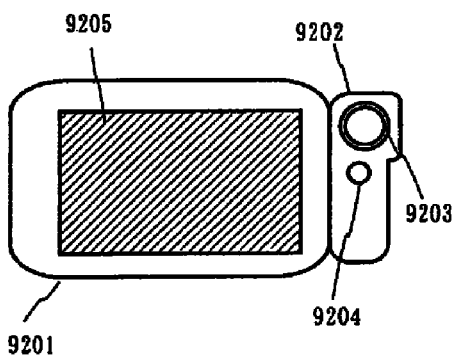

FIG. 18C is a mobile computer, and is composed of a main body 9201, a camera section 9202, an image receiving section 9203, operation switches 9204, and a display device 9205. The present invention can be applied to the image receiving section 9203 and to the display device 9205 provided with an active matrix substrate.

Figure 18D:
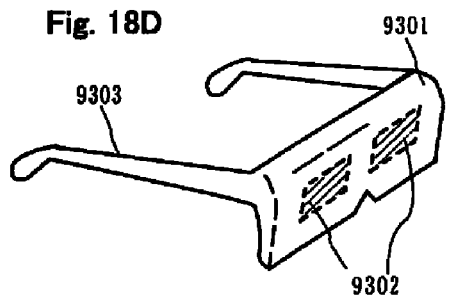

FIG. 18D is a head mount display, and is composed of a main body 9301, display devices 9302, and arm sections 9303. The present invention can be applied to the display device 9302. In addition, although not shown, the present invention can be used for other signal control circuits.

Figure 18E:
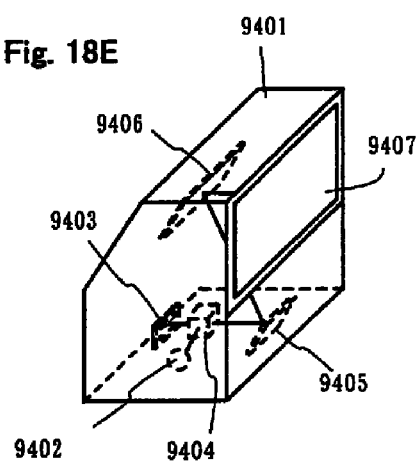

FIG. 18E is a rear type projector, and is composed of a main body 9401, a light source 9402, a display device 9403, a polarization beam splitter 9404, reflectors 9405 and 9406, and a screen 9407. The present invention can be applied to the display device 9403.

Figure 18F:
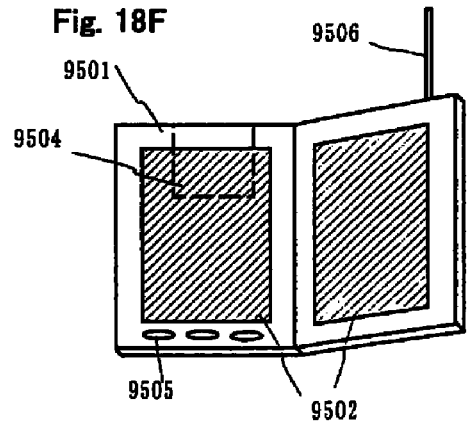

FIG. 18F is a portable book, and is composed of a main body 9501, display devices 9502 and 9503, a recording medium 9504, operation switches 9505, and an antenna 9506, and is for displaying data recorded on a mini-disc (MD) or DVD, or data received by antenna. The display devices 9502 and 9503 are direct viewing type display devices, and the present invention is applicable to them.

Figure 19A:
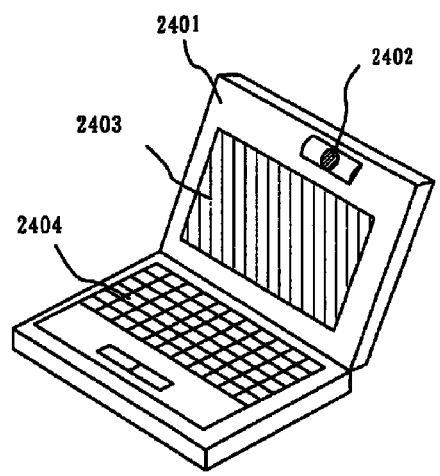
FIGS. 19A to 19C are diagrams showing examples of semiconductor devices.

FIG. 19A is a personal computer, and is composed of a main body 2401, an image input section 2402, a display device 2403, and a keyboard 2404.

Figure 19B:
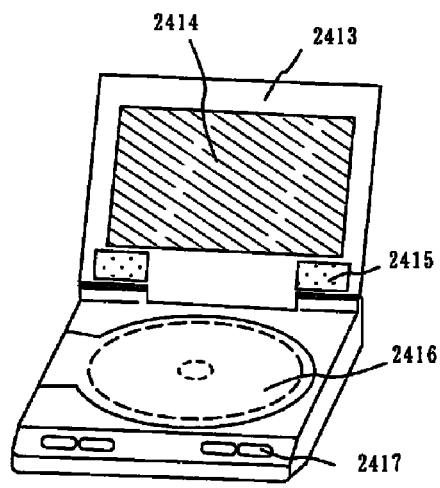

FIG. 19B is a player that uses a recording medium on which a program is recorded (hereinafter referred to as a recording medium), and is composed of a main body 2413, a display device 2414, a speaker section 2415, a recording medium 2416, and operation switches 2417. Note that music appreciation, film appreciation, games, and the use of the Internet can be performed with this device using a DVD (digital versatile disk), a CD, etc., as a recording medium. The present invention can be applied to the display device 2414, and to other signal control circuits.

Figure 19C:
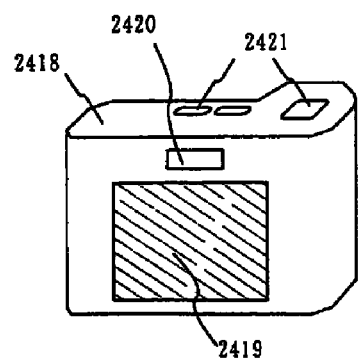

FIG. 19C is a digital camera, and is composed of a main body 2418, a display device 2419, a viewfinder 2420, operation switches 2421, and an image receiving section (not shown in the figure). The present invention can be applied to the display device 2419 and to other signal control circuits.

Figure 20A:
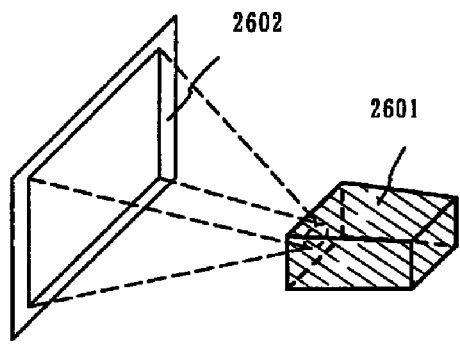
FIGS. 20A to 20D are diagrams showing examples of projectors.

FIG. 20A is a front type projector, and is composed of a projector device 2601 and a screen 2602. The present invention can be applied to the projector device 2601 and to other signal control circuits.

Figure 20B:
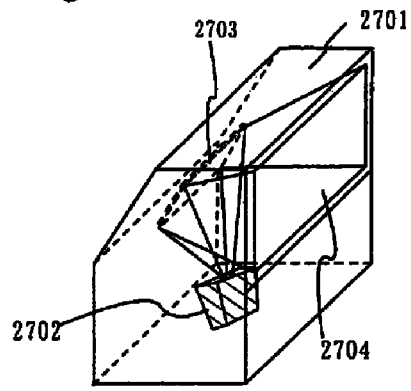

FIG. 20B is a rear type projector, and is composed of a main body 2701, a projector device 2702, a mirror 2703, and a screen 2704. The present invention can be applied to the projector device 2702 (it is especially effective for 50 to 100 inch cases), and to other signal control circuits.

Figure 20C:
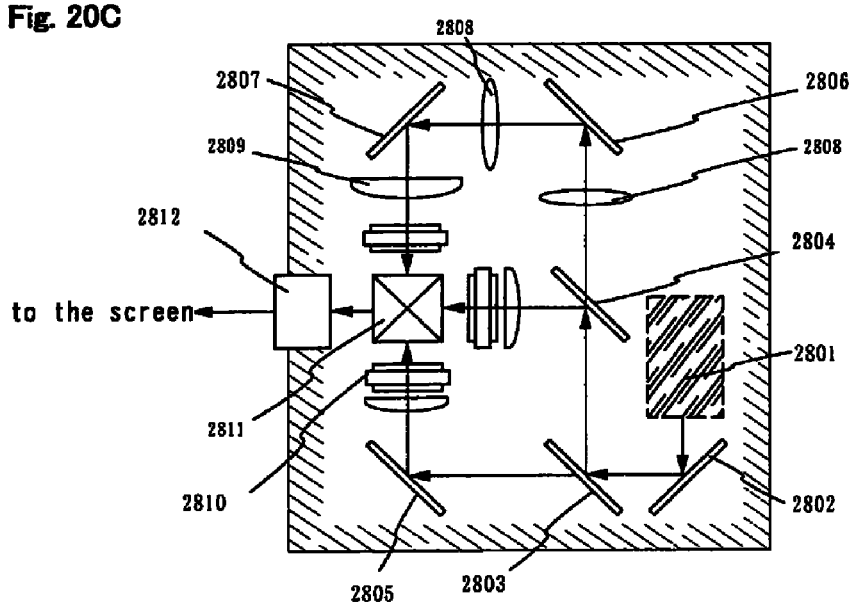

Note that FIG. 20C is a drawing showing one example of the structure of the projector devices 2601 and 2702 from FIGS. 20A and 20B. The projector devices 2601 and 2702 comprises an optical light source system 2801, mirrors 2802 and 2805 to 2807, dichroic mirrors 2803 and 2804, optical lenses 2808 and 2809, a prism 2811, a display device 2810, and an optical projection system 2812. The optical projection system 2812 is composed of an optical system provided with a projection lens. Embodiment 6 shows an example in which the liquid crystal display device 2810 is triple stage using three lenses, but there are no special limits and a single stage is acceptable, for example. Further, the operator may set optical systems such as optical lenses, film having polarizing function, film to regulate the phase difference, IR films, etc., suitably within the optical path shown by an arrow in FIG. 20C.

Figure 20D:
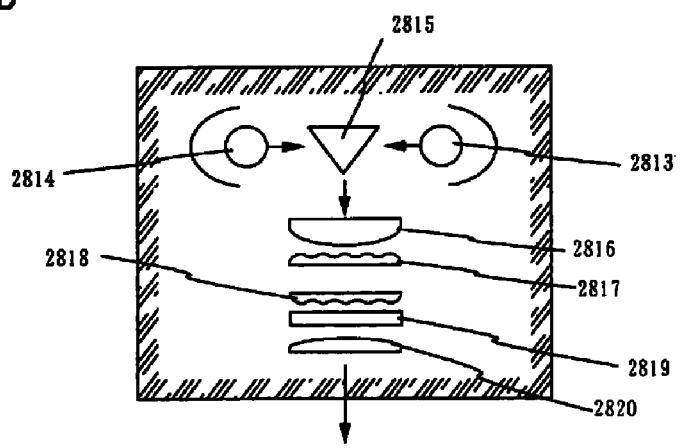

In addition, FIG. 20D shows one example of the structure of the optical light source system 2801 from FIG. 20C. In embodiment 6, the optical light source system 2801 is composed of light sources 2813 and 2814, a compound prism 2815, collimator lenses 2816 and 2820, lens arrays 2817 and 2818, and a polarizing conversion element 2819. Note that the optical light source system shown in FIG. 20D uses two light sources, but three, four, or more light sources, may be used. Of course a single light source is acceptable. Further, the operator may place optical lenses, film having polarizing function, film to regulate the phase difference, IR films, etc., suitably in the optical light source system.

In addition, although not shown in the figures, it is possible to apply the present invention to image sensors and EL type display devices. Thus the applicable range of the present invention is extremely wide, and it is possible to apply the present invention to electronic equipment in all fields.

Furthermore, although not shown in the figures, it is possible to apply the present invention to the display sections of car navigation systems, image sensors, and personal computers. Thus the applicable range of the present invention is extremely wide, and it is possible to apply the present invention to electronic equipment in all fields.

Embodiment 7

An explanation of the example of the manufacture of an active matrix type EL (electro-luminescence) display device using the present invention is given in embodiment 7.

Figure 21A:
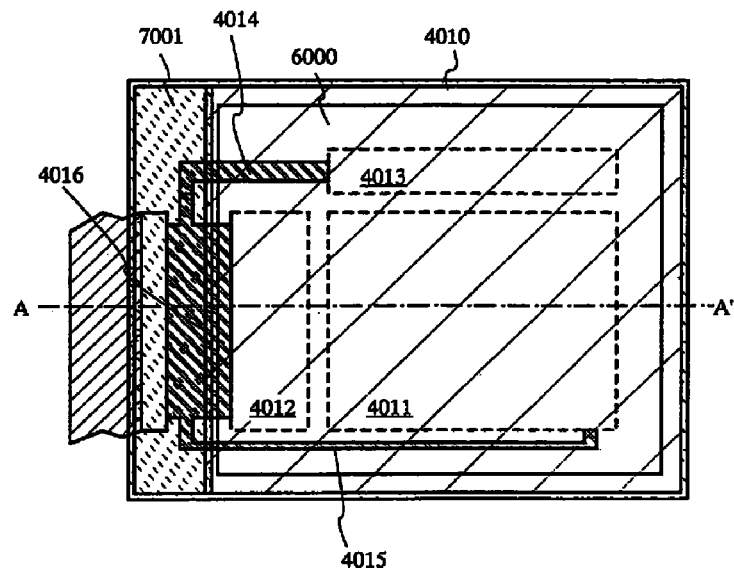
FIGS. 21A and 21B are a top view and a cross sectional diagram of an active matrix type EL display device.

FIG. 21A is a top view of an EL display device using the present invention. In FIG. 21A, reference numeral 4010 denotes a substrate, 4011 denotes a pixel section, 4012 denotes a source side driver circuit, and 4013 denotes a gate side driver circuit. Both drive circuits lead to an FPC 4017 through wirings 4014 to 4016, and thus connect to external equipment.

A cover 6000, a sealing material (also called a housing material) 7000, and a sealant (a second sealing material) 7001 are formed so as to surround at least the pixel section, and preferably both the pixel section and the driver circuits at this point.

Figure 21B:
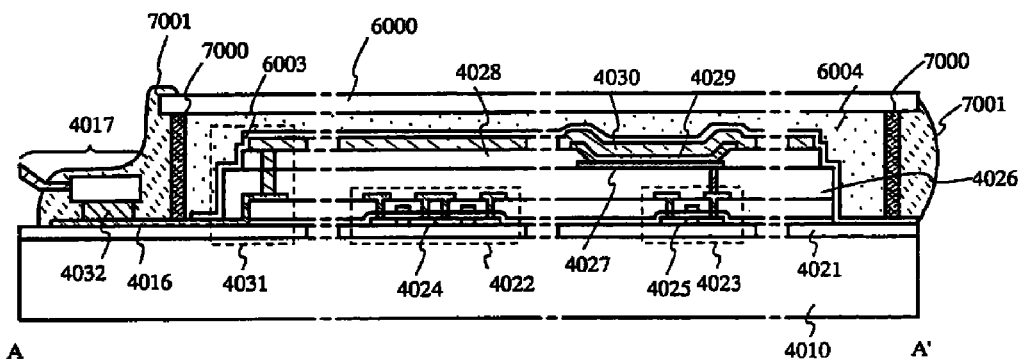

FIG. 21B is the cross sectional structure of the EL display device of embodiment 8. A driver circuit TFT (a CMOS circuit combining an n-channel TFT and a p-channel TFT is shown here) 4022 and a pixel section TFT 4023 (the only TFT that controls the current to the EL element is shown here.) are formed on the substrate 4010 and a base film 4021.

The present invention can be used for the driver circuit TFT 4022 and for the pixel section TFT 4023.

After completing the driver circuit TFT 4022 and the pixel section TFT 4023 using the present invention, a pixel electrode 4027 is formed by a transparent conductive film, on an interlayer insulating film (a flattening film) 4026 made of resin material, in order to electrically connect to the drain of the pixel section TFT 4023. When the pixel electrode 4027 is formed by a transparent conductive film, the p-channel TFT is preferably used for the pixel section TFT. An indium oxide and tin oxide compound (called ITO), or an indium oxide and zinc oxide compound can be used as the transparent conductive film. Then, after forming the pixel electrode 4027, an insulating film 4028 is formed, and an open section is formed on the pixel electrode 4027.

An EL layer 4029 is formed next. Any known EL materials (hole injection layer, hole transport layer, illumination layer, electron transport layer, electron injection layer) may be freely combined and used in a laminate structure or a single layer structure. A known technique may be used to determine the structure type. Further, there are low molecular materials and high molecular materials (polymers) as EL materials. An evaporation method is used for low molecular materials, but it is possible to use an easy method such as spin coating, printing, or injecting for high molecular materials.

The EL layer is formed in embodiment 7 by an evaporation method using a shadow mask. By using a shadow mask and forming a luminescence layer that can emit different wavelengths of light for each pixel (red light emitting layer, green light emitting layer, and blue light emitting layer), color display is possible. Any other form may be used, such as combining color changing layers (CCM) with color filters, and combining white light emitting layers with color filters. Of course a single color emitting EL display device is also possible.

After forming the EL layer 4029, a cathode 4030 is formed on top. It is preferable to remove as much as possible of the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in embodiment 7 by using a multi-chamber system (cluster tool system) deposition device.

Note that a laminate structure of a LiF (lithium fluoride) film and an Al (aluminum) film is used for the cathode 4030 in embodiment 7. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 in the region denoted with the reference numeral 4031. The wiring 4016 is a power supply line in order to apply a preset voltage to the cathode 4030, and is connected to the FPC 4017 through a conductive paste material 4032.

The region denoted by reference numeral 4031 electrically connects the cathode 4030 and the wiring 4016, so it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may proceed in one shot all the way to the interlayer insulating film 4026 when etching the insulating film 4028. In this case the contact holes can have a good shape provided that the interlayer insulating film 4026 and the insulating film 4028 are the same resin material.

A passivation film 6003, a filler 6004, and a cover 6000 are formed, covering the surface of the EL element thus formed.

In addition, a sealing material is formed on the inside of the cover 6000 and the substrate 4010, so as to surround the EL element section, and the sealant 7001 (the second sealing material) is formed on the outside of the sealing material 7000.

At this point the filler 6004 also functions as an adhesive in order to bond the cover 6000. PVC (polyvinyl chloride), epoxy resin, silicone resin, PVB (polyvinyl butyral), or EVA (ethylene vinyl acetate) can be used as the filler 6004. If a drying agent is formed on the inside of the filler 6004, a moisture absorption effect can be maintained, so this is preferable.

Further, spacers may be included within the filler 6004. The spacers may be of a powdered substance such as BaO, etc., giving the spacers themselves the ability to absorb moisture.

When using spacers, the passivation film 6003 can relieve the spacer pressure. Further, a resin film, etc., can be formed separately from the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is preferable to use a sheet with a structure in which several tens of μm of aluminum foil is sandwiched by a PVF film or a Mylar film.

However, depending upon the light emission direction from the EL element (the light radiation direction), it is necessary for the cover 6000 to have light transmitting characteristics.

In addition, the wiring 4016 is electrically connected to the FPC 4017 through the opening among the sealing material 7000, the sealant 7001 and the substrate 4010. Note that an explanation of the wiring 4016 has been made, and the wirings 4014 and 4015 are also connected electrically to the FPC 4017 by similarly passing underneath the sealing material 7000 the sealant 7001.

Figure 22A:
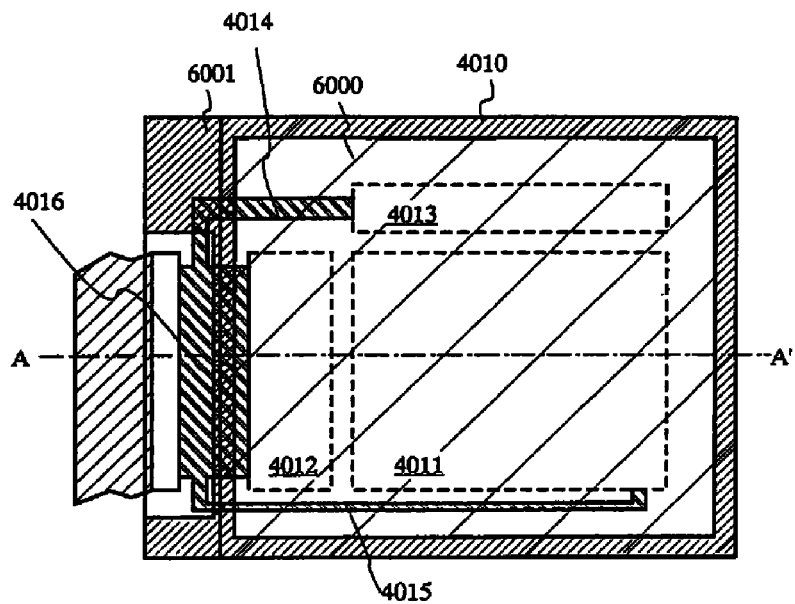
FIGS. 22A and 22B are a top view and a cross sectional diagram of an active matrix type EL display device.
Figure 22B:
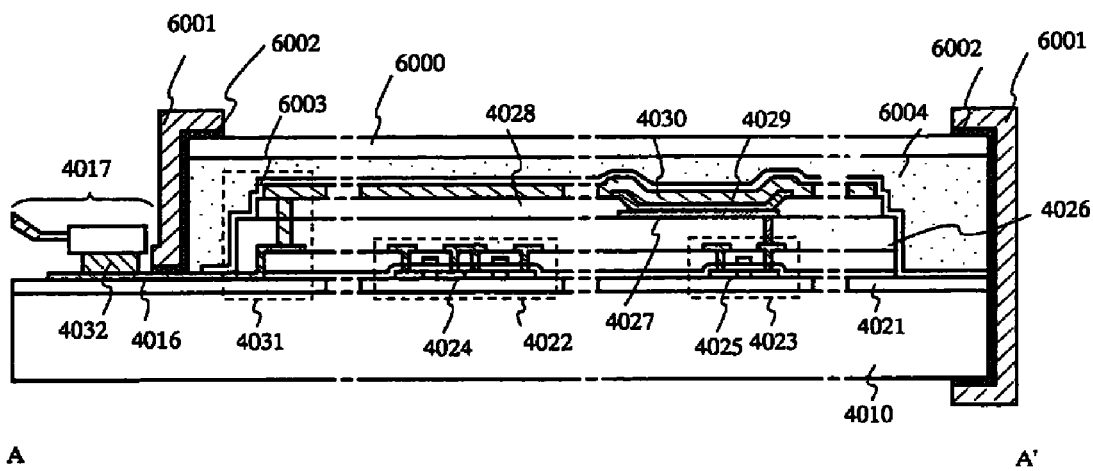

FIGS. 22A and 22B are used in embodiment 7 to explain an example of the manufacture of an EL display device with a different form. Reference numerals that are the same as in FIGS. 21A and 21B indicate the same sections, and therefore their explanation is omitted.

FIG. 22A is a top view of the EL display device of embodiment 9, and a cross sectional diagram taken along the line of A-A' in FIG. 22A is shown in FIG. 22B.

Processing is performed similar to that shown in FIGS. 21A and 21B, through the formation of the passivation film 6003 covering the surface of the EL element.

In addition, the filler 6004 is formed, covering the EL element. The filler 6004 also functions as an adhesive in order to bond to the cover 6000. PVC (polyvinyl chloride), epoxy resin, silicone resin, PVB (polyvinyl butyral), or EVA (ethylene vinyl acetate) can be used as the filler 6004. If a drying agent is formed on the inside of the filler 6004, a moisture absorption effect can be maintained, so this is preferable.

Further, spacers may be included within the filler 6004. The spacers may be of a powdered substance such as BaO, etc., giving the spacers themselves the ability to absorb moisture.

When using spacers, the passivation film 6003 can relieve the spacer pressure. Further, a resin film, etc., can be formed separately from the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is preferable to use a sheet with a structure in which several tens of μm of aluminum foil is sandwiched by a PVF film or a Mylar film.

However, depending upon the light emission direction from the EL element (the light radiation direction), it is necessary for the cover 6000 to have light transmitting characteristics.

A frame 6001 is attached so as to cover the side face (the exposed face) of the filler 6004 after bonding the cover 6000 using the filler 6004. The frame 6001 is bonded by a sealing material (functioning as an adhesive) 6002. It is preferable to use a light curing resin as the sealing material 6002 at this point, but if the heat resistance characteristics of the EL layer permit, then a thermal curing resin may also be used. Note that it is preferable that the sealing material 6002 be a material that is as impermeable as possible to water and oxygen. Further, a drying agent may be added on the inside of the sealing material 6002.

In addition, the wiring 4016 is electrically connected to the FPC 4017 through the opening between the sealing material 6002 and the substrate 4010. Note that an explanation of the wiring 4016 has been made, and the wirings 4014 and 4015 are also connected electrically to the FPC 4017 by similarly passing underneath the sealing material 6002.

Figure 23:
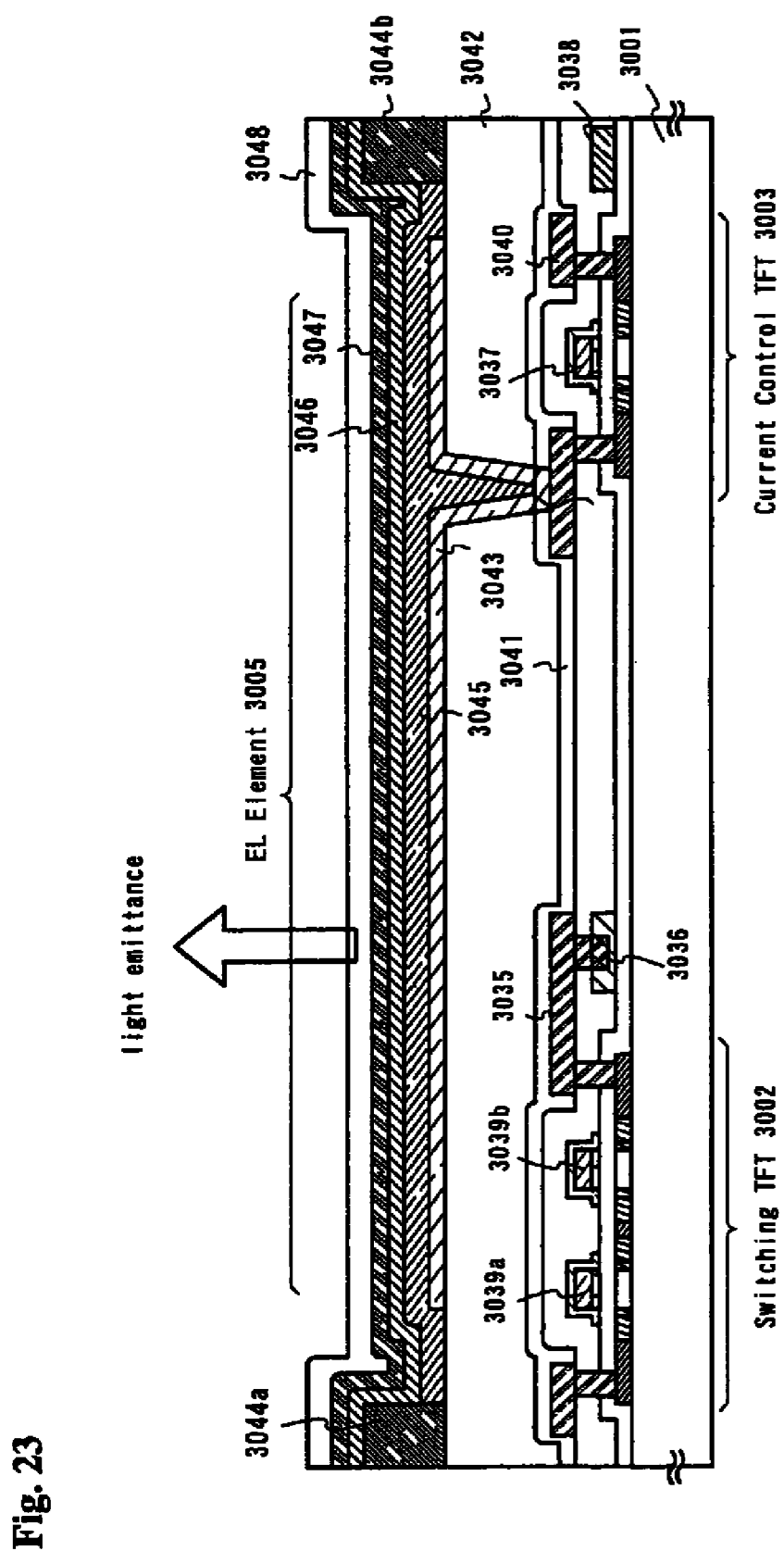
FIG. 23 is a cross sectional diagram of a pixel section of an active matrix type EL display device.
Figure 24A:
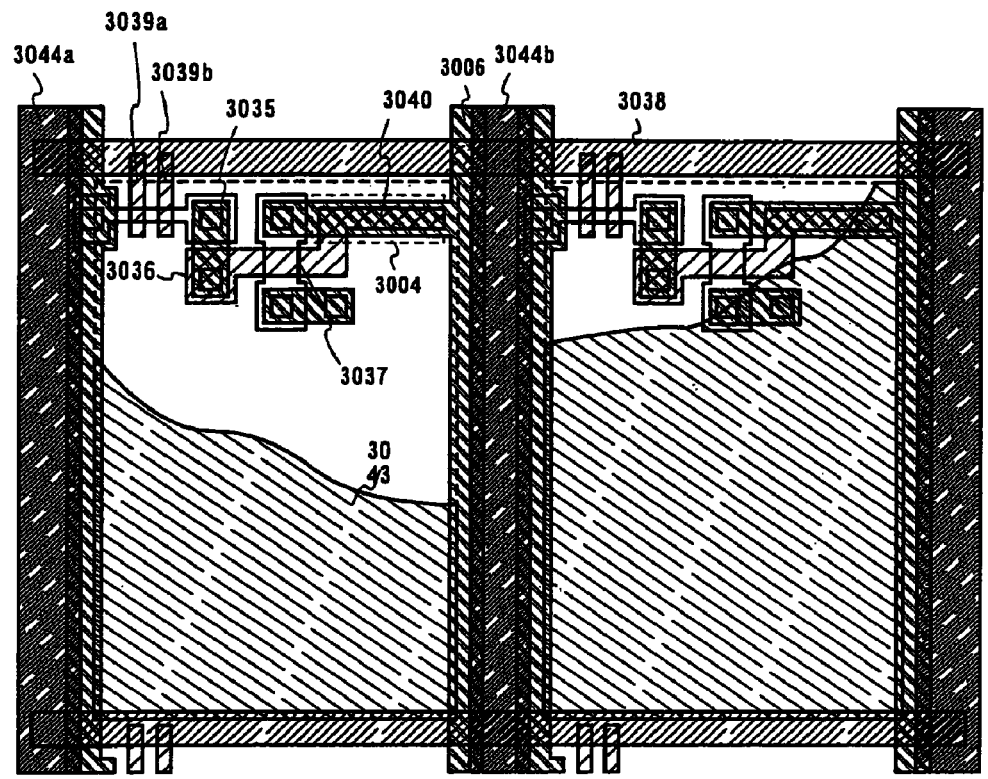
FIGS. 24A and 24B are a top view and a circuit diagram of a pixel section of an active matrix type EL device.
Figure 24B:
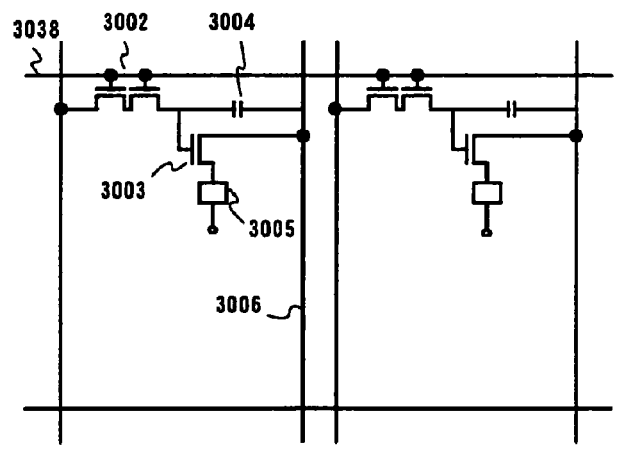

A detailed cross sectional structure of a pixel section is shown in FIG. 23, a upper surface structure is shown in FIG. 24A, and a circuit diagram is shown in FIG. 24B for the EL display device. Common reference numerals are used in FIGS. 23, 24A, and 24B, so they may be mutually referenced.

In FIG. 23, a switching TFT 3002 is formed on a substrate 3001 using an n-channel TFT formed by using the present invention. (Refer to embodiments 1 to 7.) A double gate structure is used in embodiment 7, but there are no large differences in structure and manufacturing processes, so that explanation is omitted. However, by using a double gate structure, in essence the structure is two TFTs in series, which has the advantage that the off current value can be lowered. Note that although embodiment 7 has a double gate structure, a single gate structure may also be used, as may a triple gate structure or a multiple gate structure having a larger number of gates.

In addition, a current control TFT 3003 is formed using an n-channel TFT of the present invention. At this point a drain wiring 3035 of the switching TFT 3002 is electrically connected to a gate electrode 3037 of the current control TFT by a wiring 3036. Further, the wiring denoted by reference numeral 3038 is a gate wiring that electrically connects gate electrodes 3039a and 3039b on the switching TFT 3002.

The fact that the current control TFT 3003 has the structure of the present invention has an extremely important meaning at this point. A current control TFT is an element for controlling the amount of current flowing in an EL element, and there is much current flow, so it is an element in which there is a great danger of degradation due to heat or due to hot carriers. Therefore, the structure of the present invention, in which a GOLD region (second impurity region) is formed to overlap a gate electrode through a gate insulating, is extremely effective on the drain side of the current control TFT.

Additionally, a single gate structure is shown in the figures for the current control TFT 3003 in embodiment 7, but a multiple-gate structure, with a plural number of TFTs connected in series, may also be used. Further, a structure so as to perform heat radiation with a high efficiency, in which a plural number of TFTs are connected in parallel, in essence dividing the channel forming region into a plural number of channel forming regions, may also be used. This type of structure is an effective countermeasure to heat degradation.

As shown in FIG. 24A, the wiring that becomes the gate electrode 3037 of the current control TFT 3000 overlaps a drain wiring 3040 on the current control TFT 3003, through an insulating film in the region shown by reference numeral 3004. At this point a capacitor is formed in the region shown by reference numeral 3004. The capacitor 3004 functions as a capacitor in order to store the voltage applied to the gate on the current control TFT 3003. Note that the drain wiring 3040 is connected to a current supply line (power supply line) 3006, and a fixed voltage is always applied.

A first passivation film 3041 is formed over the switching TFT 3002 and the current control TFT 3003, and a flattening film 3042 is formed on top of that by an insulating resin film. It is very important to flatten the step due to the TFTs using the flattening film 3042. An EL layer formed later is extremely thin, so that there are cases that cause the luminescence to be defective due to the existence of the step. Therefore, to form the EL layer with as level a surface as possible, it is preferable to perform flattening before forming a pixel electrode.

The reference numeral 3043 denotes a pixel electrode (EL element cathode) from a conductive film with high reflectivity, and is electrically connected to the drain of the current control TFT 3003. In this case it is preferable to use an n-channel TFT as the current control TFT. It is preferable to use a low resistance conductive film, such as an aluminum alloy film, a copper alloy film, or a silver alloy film, etc., or a laminate of such films. Of course, a laminate structure with other conductive films may be used.

Furthermore, a luminescence layer 3045 is formed in the middle of the groove (corresponding to the pixel) formed by banks 3044a and 3044b formed by insulating films (preferably resins). Note that only one pixel is shown in the figures here, but the luminescence layer may be divided to correspond to each of the colors R (red), G (green), and B (blue). A π-conjugate polymer material is used as an organic EL material that is the luminescence layer. Polyparaphenylene vinylenes (PPVs), polyvinyl carbazoles (PVCs), and polyfluoranes can be given as typical polymer materials.

Note that there are several types of PPV organic EL materials, and materials described in Shenk, H., Becker, H., Gelsen, O., Kluge, E., Kreuder, W., and Spreitzer, H., Polymers for Light Emitting Diodes, Euro Display Proceedings, 1999, p. 33-7, and in Japanese Patent Application Laid-Open No. Hei 10-92576, for example, may be used.

As specific luminescence layers, cyano-polyphenylene vinylene may be used as a red light emitting luminescence layer, polyphenylene vinylene may be used as a blue light radiating luminescence layer, and polyphenylene vinylene or polyalkylphenylene may be used as a blue light radiating luminescence layer. The film thicknesses may be between 30 and 150 nm (preferably between 40 and 100 nm).

However, the above example is one example of the organic EL materials that can be used as luminescence layers, and it is not necessary to limit use to these materials. An EL layer (a layer for luminescence and for performing carrier motion for luminescence) may be formed by freely combining luminescence layers, charge transport layers, or charge injection layers.

For example, an example using polymer materials as luminescence layers is shown in embodiment 7, but low molecular organic EL materials may also be used. Further, it is possible to use inorganic materials such as silicon carbide, etc., as charge transport layers and charge injection layers. Known materials can be used for these organic EL materials and inorganic materials.

A laminate structure EL layer, in which a hole injection layer 3046 from PEDOT (polythiophene) or PAni (polyaniline) is formed on the luminescence layer 3045, is used in embodiment 7. An anode 3047 is then formed on the hole-injection layer 3046 from a transparent conductive film. The light generated by the luminescence layer 3045 is radiated toward the upper surface (toward the top of the TFT) in the case of embodiment 7, so the anode must have light transmitting characteristics. An indium oxide and tin oxide compound, or an indium oxide and zinc oxide compound can be used for the transparent conductive film. However, because it is formed after forming the low heat resistance luminescence layer and hole injection layer, it is preferable to use a material that can be deposited at as low a temperature as possible.

At the point where the anode 3047 is formed, an EL element 3005 is completed. Note that what is called the EL element 3005 here indicates the capacitor formed by the pixel electrode (cathode) 3043, the luminescence layer 3045, the hole-injection layer 3046, and the anode 3047. As shown in FIG. 24A, the pixel electrode 3043 nearly matches the area of the pixel, so the entire pixel functions as an EL element. Therefore, the luminescence usage efficiency is very high, and a bright image display is possible.

A second passivation film 3048 is then formed in addition on the anode 3047 in embodiment 7. It is preferable to use a silicon nitride film or an oxidized silicon nitride film as the second passivation film 3048. The purpose of this is the isolation of the EL element and the outside, and has meaning in preventing degradation due to the oxidation of the organic EL material, and in controlling gaseous emitted from the organic EL material. Thus the reliability of an EL display device can be raised.

Thus the EL display panel of the present invention 7 has a pixel section from pixels structured as in FIG. 23, and has a switching TFT with sufficiently low off current value, and a current control TFT with strong hot carrier injection. Therefore, an EL display panel that has high reliability, and in which good image display is possible, can be obtained.

Note that it is possible to implement the constitution of FIG. 23 by freely combining it with the constitutions of embodiment mode 1 and embodiments 1 to 4. Note that it is effective to use the EL display device of embodiment 7 as the display section of the electronic equipment of embodiment 6.

Figure 25:
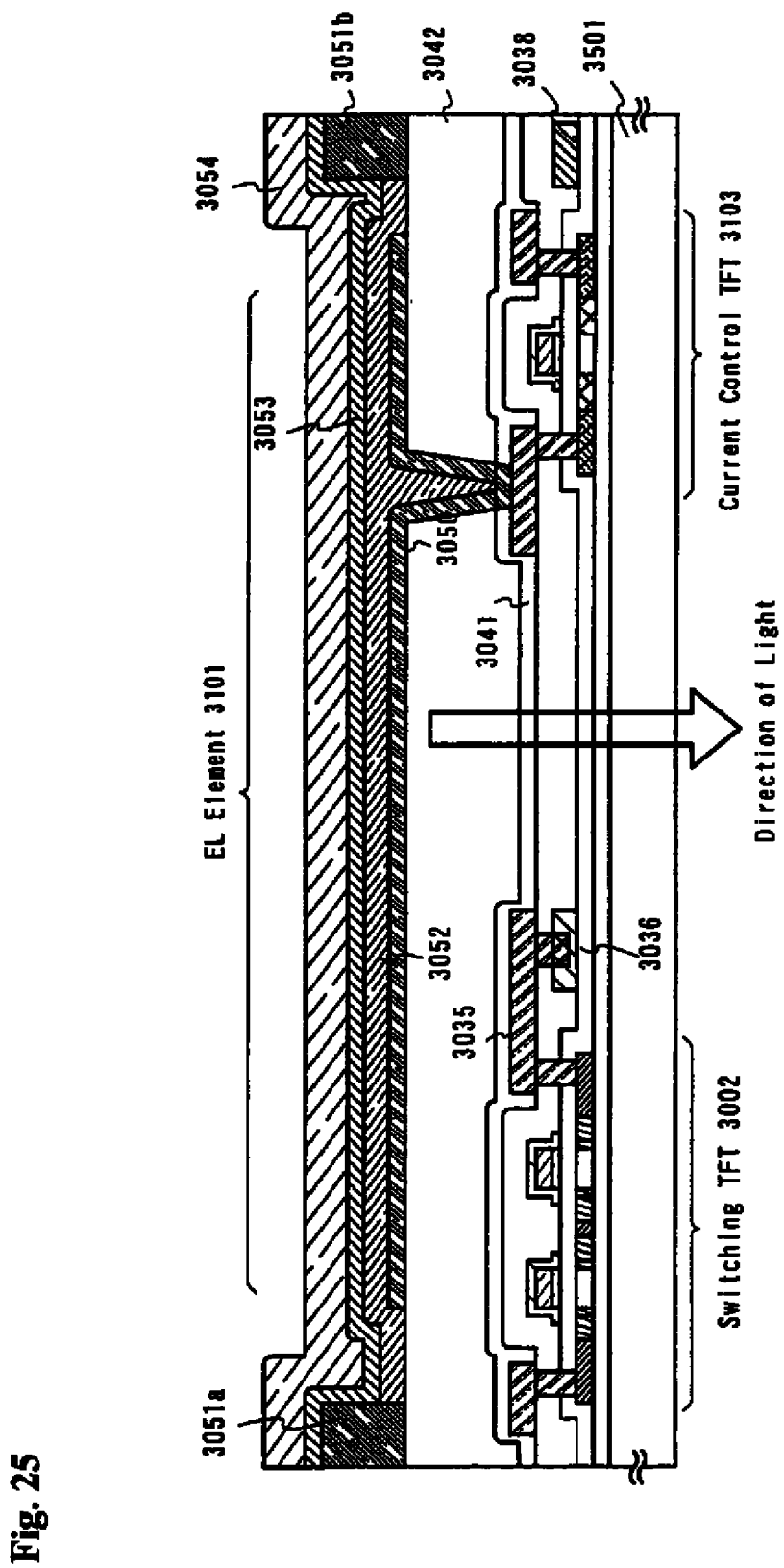
FIG. 25 is a cross sectional diagram of a pixel section of an active matrix type EL display device.

Next, a structure in which the structure of the EL element 3005 is inverted is explained as another constitution of the pixel section. FIG. 25 is used in the explanation. Note that the only points that differ from the structure of FIG. 23 are the EL element section and the current control TFT, so other explanations are omitted.

The p-channel TFT of the present invention is used for the current control TFT 3103 in FIG. 25. Embodiment mode 1 and embodiments 1 to 4 may be referred to for the manufacturing process.

A transparent conductive film is used as a pixel electrode (anode) 3050 in FIG. 25. Specifically, an indium oxide and zinc oxide compound conductive film is used. Of course, an indium oxide and tin oxide compound conductive film may also be used.

Then, after forming banks 3051a and 3051b from insulating films, a luminescence layer 3052 is formed from polyvinyl carbazole by solution coating. An electron injection layer 3053 is formed on top from potassium acetylacetonate (denoted acacK), and a cathode 3054 is formed from an aluminum alloy. In this case the cathode 3054 also functions as a passivation film. Thus an EL element 3101 is formed.

The light generated by the luminescence layer 3052 is radiated toward the substrate on which the TFT is formed, as shown by the arrows.

Note that it is possible to implement the constitution of FIG. 25 by freely combining it with the constitutions of embodiment mode 1 and embodiments 1 to 4. In addition, it is effective to use the EL display panel of embodiment 7 as the display section of the electronic equipment of embodiment 6.

Figure 26A:
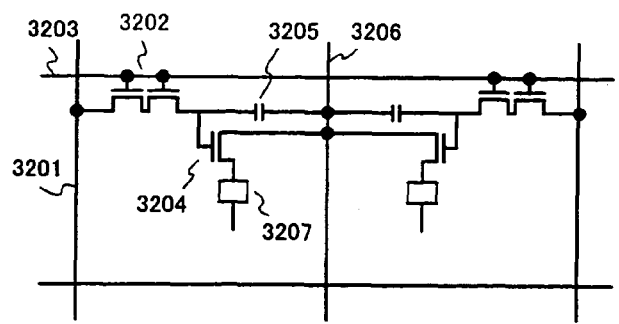
FIGS. 26A to 26C are circuit diagrams of a pixel section of an active matrix type EL display device.
Figure 26B:
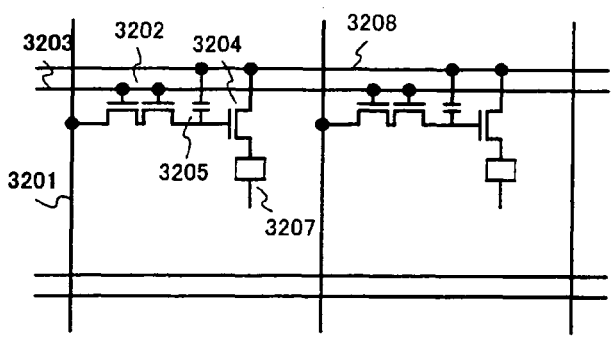
Figure 26C:
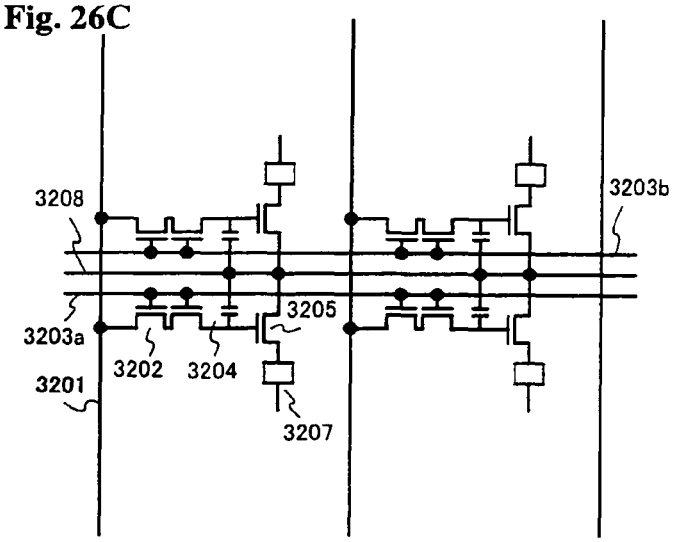

An example of a case of a pixel with a different structure from that of the circuit diagram of FIG. 24B is shown in FIGS. 26A to 26C. Note that in embodiment 7, reference numeral 3201 denotes a source wiring of a switching TFT 3202, 3203 denotes a gate wiring of the switching TFT 3202, 3204 denotes a current control TFT, 3205 denotes a capacitor, 3206 and 3208 denote current supply lines, and 3207 denotes an EL element.

FIG. 26A is an example of a case in which the current supply line 3206 is shared between two pixels. Namely, this is characterized in that two pixels are formed having linear symmetry around the current supply line 3206. In this case the number of power supply lines can be reduced, so the pixel section can be made higher definition.

FIG. 26B is an example of a case in which the current supply line 3208 is formed parallel to the gate wiring 3203. Note that FIG. 26B has a structure in which the current supply line 3208 and the gate wiring 3203 are formed so as not to overlap, but if both are wirings formed on different layers, then they can be formed to overlap through an insulating film. In this case, the area used exclusively by the current supply line 3208 and the gate wiring 3203 can be shared, so the pixel section can be made higher definition.

Furthermore, FIG. 26C is characterized in that the current supply line 3208 is formed parallel to gate wirings 3203a, 3203b, similar to the structure of FIG. 26B, and in addition, two pixels are formed to have linear symmetry around the current supply line 3208. It is also effective to form the current supply line 3208 to overlap one gate wiring 3203a or 3203b. In this case the number of power supply lines can be reduced, so the pixel section can be made higher definition.

Note that it is possible to implement the constitution of the circuit shown in FIGS. 26A to 26C by freely combining with the constitutions of embodiment mode 1 and embodiments 1 to 4. In addition, it is effective to use an EL display device having the pixel structure of embodiment 7 as the display section of the electronic equipment of embodiment 6.

A structure in which a capacitor 3004 is formed in order to store the voltage applied to the current control TFT 3003 gate is used in FIGS. 24A and 24B, but it is possible to omit the capacitor 3004. An n-channel TFT of the present invention as shown in embodiments 1 to 7 is used as the current control TFT 3003, so it has a GOLD region (second impurity region)

formed so as to overlap the gate electrode through a gate insulating film. A parasitic capacitor, generally called a gate capacitor, is formed in the overlapping region, and embodiment 7 is characterized in that the parasitic capacitor is actively used as a substitute for the capacitor 3004.

The capacitance of the parasitic capacitor changes in accordance with the area of the overlap between the gate electrode and the GOLD region, so the length of the GOLD region in the overlapping region determines the capacitance.

Furthermore, it is possible to similarly omit the capacitor 3205 in the structures of FIGS. 26A, 26B, and 26C.

Note that it is possible to implement this kind of constitution by freely combining it with the constitutions of embodiment mode 1 and embodiments 1 to 4. In addition, it is effective to use an EL display device having the pixel structure of embodiment 7 as the display section of the electronic equipment of embodiment 6.

Embodiment 8

Figure 27:
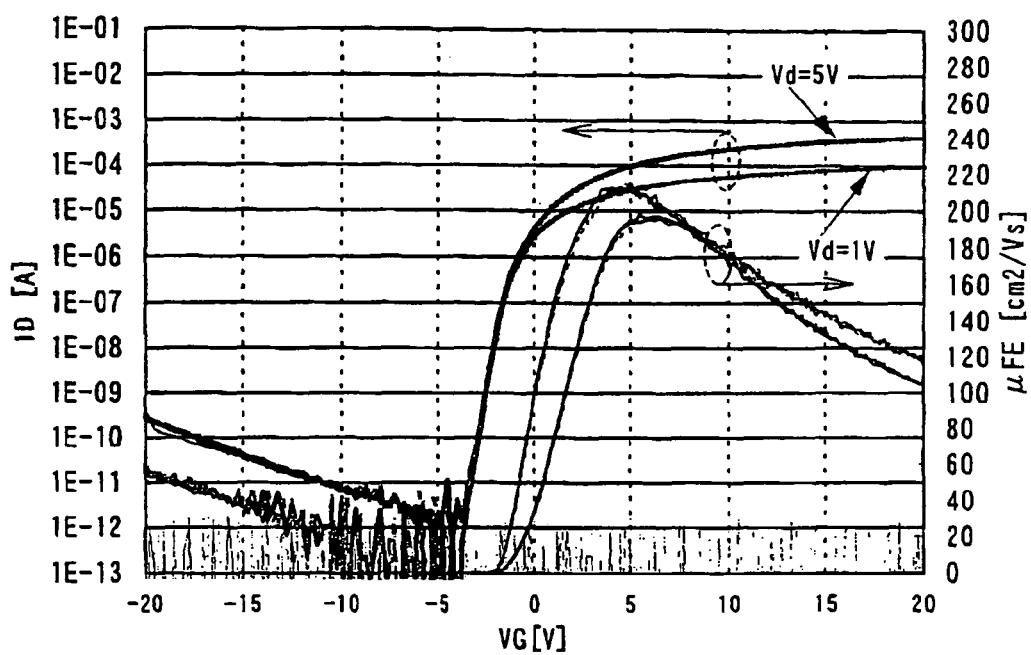
FIG. 27 is a graph representing the result of bias-temperature (B-T) examination.

FIG. 27 is a result of bias-temperature (B-T) examination to show an example of characteristic of n-channel ITT fabricated according to the description of Embodiment 1. The TFT structure shown in FIG. 27 has a channel length 8 μm, $L_{ov}$=2.5 μm and $L_{off}$ is not disposed. In the B-T examination, bias of 20V was inputted to the gate electrode and that was kept for an hour. Then the bias was broken, and heat treatment was carried out for an hour. FIG. 27 shows the result by characteristic of gate voltage (VG) versus drain current (ID) in cases of drain voltage (Vd) 1V and 5V. Due to the structure having LDD region that overlap the gate electrode, deterioration by hot carrier effect was prevented and further difference in the characteristic due to the bias stress was not observed. Also, by forming the base film in double layered structure comprising an oxidized silicon nitride (100 nm) made of $SiH_4$, $NH_3$ and $N_2O$ and an oxidized silicon nitride (200 nm) made of $SiH_4$ and $N_2O$, avoiding an effect from a movable ion included in the substrate became possible, and difference in threshold voltage was not observed in the B-T examination.

Figure 28A:
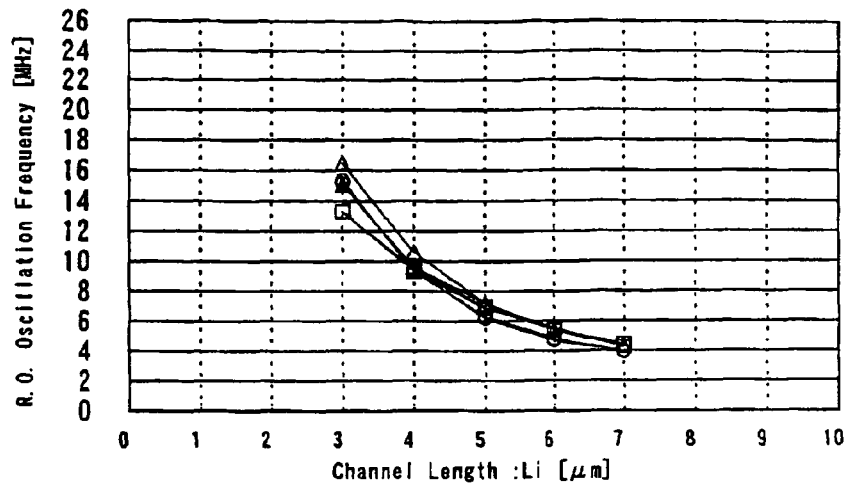
FIGS. 28A and 28B are graphs showing dynamic characteristics of a ring oscillator.
Figure 28B:
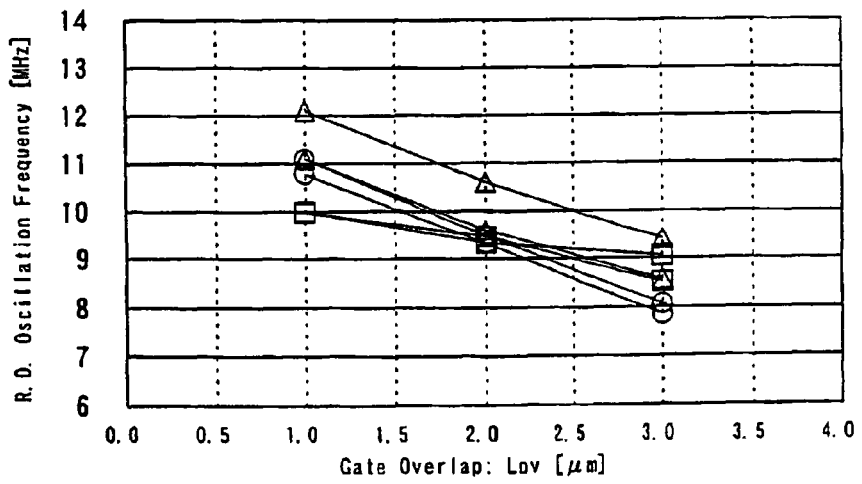

FIGS. 28A and 28B show dynamic characteristic (source voltage 10V) of a ring oscillator fabricated by using such TFTs. The ring oscillator has 19 stages. FIG. 28A shows a difference in oscillation frequency by channel length when $L_{ov}$=2 μm, with a parameter of activation condition of the doped impurity element. The oscillation frequency decreases with the increase in channel length however it is not dependent upon activation condition. When a LDD structure overlapping with a gate electrode is disposed, decrease in operation frequency by increase in parasitic capacitor of that section should be feared. However, it turned out that there is no practical problem because oscillation of frequency at 8-12 MHz was available although dependence on $L_{ov}$ length was observed upon differentiating the value of for 1-3 μm with channel length 6 μm, as shown in FIG. 28B.

As such, a TFT having oxidized silicon nitride as a base film and an LDD structure overlapping a gate electrode has a good resistance against stress due to bias or heat, and there is no deterioration by hot carrier effect. Further, because it is possible to operate them by high frequency, they are especially superior for forming a shift register circuit or a buffer circuit of the driver circuit.

In accordance with the present invention, a third impurity region that overlaps a gate electrode, and a second impurity region and a fourth impurity region which do not overlap the gate electrode, are formed as the LDD regions between a channel forming region and a drain region of an n-channel TFT, and N-channel TFTs with optimized structures corresponding to the different operating characteristics can be formed on the same substrate. For example, taking a CMOS circuit which is formed on an active matrix substrate as a base, n-channel TFTs in which a third impurity region is formed which overlaps a gate electrode, can be formed for the surrounding driver circuits, and an n-channel TFT of a pixel section with a structure in which a fourth impurity region is formed which does not overlap a gate electrode, can be made.

A storage capacitor formed in the pixel section is formed of a light shielding film, a dielectric film formed on the light shielding film, and a pixel electrode. Al is especially used in the light shielding film, and the dielectric film is formed by anodic oxidation process. By using an Al oxide film, it is possible to reduce the surface area in order to form the capacity required for an image display. In addition, by using the light shielding film formed on the pixel TFT as one electrode of the storage capacitor, the aperture ratio of the image display section of an active matrix type liquid crystal display device can be increased.

What is claimed is:
1. A portable telephone comprising:
a voice output section;
a voice input section;
operation switches;
a display device including a driver circuit and a pixel section;
wherein the driver circuit comprising:
    a third thin film transistor comprising:
    a channel forming region overlapped with a gate electrode through a gate insulating film; and
    a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
a fifth thin film transistor comprising:
    a channel forming region and a fifth impurity region having p-type conductivity which forms a source region or a drain region; and
wherein the pixel section comprises:
    a storage capacitor; and
    a fourth thin film transistor comprising:
    a channel forming region overlapped with a gate electrode through the gate insulating film; and
    a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film,
wherein a length of the second impurity region is different from a length of the fourth impurity region,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

2. A portable telephone according to claim 1, wherein each gate electrodes of the third, fourth, and fifth thin film transistors has a first layer comprising TaN and a second layer comprising Ta, Ti, Mo, or W on the first layer.

3. A portable telephone according to claim 1, wherein the length of the second impurity region is 0.5 to 3.0 μm.

4. A portable telephone according to claim 1, wherein the third and fifth thin film transistor constitute a sampling circuit.

5. A portable telephone according to claim 1, wherein a boundary between the second impurity region and the channel forming region of the third thin film transistor is align with a side surface of the gate electrode of the third thin film transistor.

6. A portable telephone according to claim 1, wherein a boundary between the fourth impurity region and the channel forming region of the fourth thin film transistor is align with a side surface of the gate electrode of the fourth thin film transistor.

7. A portable telephone according to claim 1, wherein a boundary between the fifth impurity region and the channel forming region of the fifth thin film transistor is align with a side surface of the gate electrode of the fifth thin film transistor.

8. A portable telephone according to claim 1,
wherein the light shielding film comprises an element selected from a group consisting of aluminum, tantalum, and titanium.

9. A portable telephone according to claim 8,
wherein the dielectric film comprises an oxide of the element of the light shielding film.

10. A portable telephone comprising:
a voice output section;
a voice input section;
operation switches;
a display device including a driver circuit and a pixel section over a glass substrate;
wherein the driver circuit comprising:
a third thin film transistor comprising:
a channel forming region overlapped with a gate electrode through a gate insulating film; and
a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
a fifth thin film transistor comprising:
a channel forming region and a fifth impurity region having p-type conductivity which forms a source region or a drain region; and
wherein the pixel section comprises:
a storage capacitor; and
a fourth thin film transistor comprising:
a channel forming region overlapped with a gate electrode through the gate insulating film; and
a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film,
wherein the second impurity region is adjacent to the channel forming region of the third thin film transistor and the first impurity region,
wherein a length of the second impurity region is different from a length of the fourth impurity region,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

11. A portable telephone according to claim 10, wherein each gate electrodes of the third, fourth, and fifth thin film transistors has a first layer comprising TaN and a second layer comprising Ta, Ti, Mo, or W on the first layer.

12. A portable telephone according to claim 10, wherein the length of the second impurity region is 0.5 to 3.0 μm.

13. A portable telephone according to claim 10, wherein the third and fifth thin film transistor constitute a sampling circuit.

14. A portable telephone according to claim 10, wherein a boundary between the second impurity region and the channel forming region of the third thin film transistor is align with a side surface of the gate electrode of the third thin film transistor.

15. A portable telephone according to claim 10, wherein a boundary between the fourth impurity region and the channel forming region of the fourth thin film transistor is align with a side surface of the gate electrode of the fourth thin film transistor.

16. A portable telephone according to claim 10, wherein a boundary between the fifth impurity region and the channel forming region of the fifth thin film transistor is align with a side surface of the gate electrode of the fifth thin film transistor.

17. A camera comprising:
an image receiving section;
operation switches;
a display device including a driver circuit and a pixel section;
wherein the driver circuit comprising:
a third thin film transistor comprising:
a channel forming region overlapped with a gate electrode through a gate insulating film; and
a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
a fifth thin film transistor comprising:
a channel forming region and a fifth impurity region having p-type conductivity which forms a source region or a drain region; and
wherein the pixel section comprises:
a storage capacitor; and
a fourth thin film transistor comprising:
a channel forming region overlapped with a gate electrode through the gate insulating film; and
a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film, wherein a length of the second impurity region is different from a length of the fourth impurity region, wherein the storage capacitor is formed by a light shielding film over the fourth thin film transistor, a dielectric film over the light shielding film, and a pixel electrode over the dielectric film, wherein the pixel electrode is connected to the fourth thin film transistor through an opening formed in a spacer, and wherein the spacer is provided on and in contact with the light shielding film.

18. A portable telephone according to claim 10, wherein the light shielding film comprises an element selected from a group consisting of aluminum, tantalum, and titanium.

19. A portable telephone according to claim 18, wherein the dielectric film comprises an oxide of the element of the light shielding film.

20. A camera according to claim 17, wherein a boundary between the fifth impurity region and the channel forming region of the fifth thin film transistor is align with a side surface of the gate electrode of the fifth thin film transistor.

21. A camera according to claim 17, wherein each gate electrodes of the third, fourth, and fifth thin film transistors has a first layer comprising TaN and a second layer comprising Ta, Ti, Mo, or W on the first layer.

22. A camera according to claim 17, wherein the length of the second impurity region is 0.5 to 3.0 µm.

23. A camera according to claim 17, wherein the third and fifth thin film transistor constitute a sampling circuit.

24. A camera according to claim 17, wherein a boundary between the second impurity region and the channel forming region of the third thin film transistor is align with a side surface of the gate electrode of the third thin film transistor.

25. A camera according to claim 17, wherein a boundary between the fourth impurity region and the channel forming region of the fourth thin film transistor is align with a side surface of the gate electrode of the fourth thin film transistor.

26. A camera according to claim 17,
wherein the light shielding film comprises an element selected from a group consisting of aluminum, tantalum, and titanium.

27. A camera according to claim 26,
wherein the dielectric film comprises an oxide of the element of the light shielding film.

28. A camera comprising:
an image receiving section;
operation switches;
a display device including a driver circuit and a pixel section over a glass substrate;
wherein the driver circuit comprising:
 a third thin film transistor comprising:
  a channel forming region overlapped with a gate electrode through a gate insulating film; and
  a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
 a fifth thin film transistor comprising:
  a channel forming region and a fifth impurity region having p-type conductivity which forms a source region or a drain region; and
wherein the pixel section comprises:
 a storage capacitor; and
 a fourth thin film transistor comprising:
  a channel forming region overlapped with a gate electrode through the gate insulating film; and
  a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film,
wherein the second impurity region is adjacent to the channel forming region of the third thin film transistor and the first impurity region,
wherein a length of the second impurity region is different from a length of the fourth impurity region,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

29. A camera according to claim 28, wherein each gate electrodes of the third, fourth, and fifth thin film transistors has a first layer comprising TaN and a second layer comprising Ta, Ti, Mo, or W on the first layer.

30. A camera according to claim 28, wherein the length of the second impurity region is 0.5 to 3.0 µm.

31. A camera according to claim 28, wherein the third and fifth thin film transistor constitute a sampling circuit.

32. A camera according to claim 28, wherein the camera is a digital camera.

33. A camera according to claim 28, wherein the camera is a video camera.

34. A camera according to claim 28, wherein a boundary between the second impurity region and the channel forming region of the third thin film transistor is align with a side surface of the gate electrode of the third thin film transistor.

35. A camera according to claim 28, wherein a boundary between the fourth impurity region and the channel forming region of the fourth thin film transistor is align with a side surface of the gate electrode of the fourth thin film transistor.

36. A camera according to claim 28, wherein a boundary between the fifth impurity region and the channel forming region of the fifth thin film transistor is align with a side surface of the gate electrode of the fifth thin film transistor.

37. A camera according to claim 28,
wherein the light shielding film comprises an element selected from a group consisting of aluminum, tantalum, and titanium.

38. A camera according to claim 37,
wherein the dielectric film comprises an oxide of the element of the light shielding film.

39. A computer comprising:
operation switches;
a display device including a driver circuit and a pixel section;
wherein the driver circuit comprising:

a third thin film transistor comprising:
  a channel forming region overlapped with a gate electrode through a gate insulating film; and
  a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
a fifth thin film transistor comprising:
  a channel forming region and a fifth impurity region having p-type conductivity which forms a source region or a drain region; and
wherein the pixel section comprises:
  a storage capacitor; and
  a fourth thin film transistor comprising:
    a channel forming region overlapped with a gate electrode through the gate insulating film; and
    a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film,
wherein a length of the second impurity region is different from a length of the fourth impurity region,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

40. A computer according to claim 39, wherein each gate electrodes of the third, fourth, and fifth thin film transistors has a first layer comprising TaN and a second layer comprising Ta, Ti, Mo, or W on the first layer.

41. A computer according to claim 39, wherein the length of the second impurity region is 0.5 to 3.0 µm.

42. A computer according to claim 39, wherein the third and fifth thin film transistor constitute a sampling circuit.

43. A computer according to claim 39, wherein the computer is a mobile computer.

44. A computer according to claim 39, wherein the computer is a lap-top computer.

45. A computer according to claim 39, wherein a boundary between the second impurity region and the channel forming region of the third thin film transistor is align with a side surface of the gate electrode of the third thin film transistor.

46. A computer according to claim 39, wherein a boundary between the fourth impurity region and the channel forming region of the fourth thin film transistor is align with a side surface of the gate electrode of the fourth thin film transistor.

47. A computer according to claim 39, wherein a boundary between the fifth impurity region and the channel forming region of the fifth thin film transistor is align with a side surface of the gate electrode of the fifth thin film transistor.

48. A computer according to claim 39,
wherein the light shielding film comprises an element selected from a group consisting of aluminum, tantalum, and titanium.

49. A computer according to claim 48,
wherein the dielectric film comprises an oxide of the element of the light shielding film.

50. A computer comprising:
operation switches;
a display device including a driver circuit and a pixel section over a glass substrate;
wherein the driver circuit comprising:
  a third thin film transistor comprising:
    a channel forming region overlapped with a gate electrode through a gate insulating film; and
    a second impurity region having an n-type conductivity and a first impurity region having the n-type conductivity which forms a source region or a drain region, wherein the second impurity region is between the channel forming region and the first impurity region, and wherein the first impurity region and the second impurity region are not overlapped with the gate electrode through the gate insulating film; and
  a fifth thin film transistor comprising:
    a channel forming region and a fifth impurity region having p-type conductivity which forms a source region or a drain region; and
wherein the pixel section comprises:
a storage capacitor; and
a fourth thin film transistor comprising:
  a channel forming region overlapped with a gate electrode through the gate insulating film; and
  a fourth impurity region having the n-type conductivity and a first impurity region having the n-type conductivity which forms a source region or a drain region, wherein the fourth impurity region is between the channel forming region and the first impurity region, and wherein the first impurity region and the fourth impurity region are not overlapped with the gate electrode through the gate insulating film,
wherein the second impurity region is adjacent to the channel forming region of the third thin film transistor and the first impurity region,
wherein a length of the second impurity region is different from a length of the fourth impurity region,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

51. A computer according to claim 50, wherein each gate electrodes of the third, fourth, and fifth thin film transistors has a first layer comprising TaN and a second layer comprising Ta, Ti, Mo, or W on the first layer.

52. A computer according to claim 50, wherein the length of the second impurity region is 0.5 to 3.0 µm.

53. A computer according to claim 50, wherein the third and fifth thin film transistor constitute a sampling circuit.

54. A computer according to claim 50, wherein the computer is a mobile computer.

55. A computer according to claim 50, wherein the computer is a lap-top computer.

56. A computer according to claim 50, wherein a boundary between the second impurity region and the channel forming region of the third thin film transistor is align with a side surface of the gate electrode of the third thin film transistor.

57. A computer according to claim 50, wherein a boundary between the fourth impurity region and the channel forming region of the fourth thin film transistor is align with a side surface of the gate electrode of the fourth thin film transistor.

58. A computer according to claim 50, wherein a boundary between the fifth impurity region and the channel forming region of the fifth thin film transistor is align with a side surface of the gate electrode of the fifth thin film transistor.

59. A computer according to claim 50,
wherein the light shielding film comprises an element selected from a group consisting of aluminum, tantalum, and titanium.

60. A computer according to claim 59,
wherein the dielectric film comprises an oxide of the element of the light shielding film.

61. An article comprising:
a display device including a driver circuit and a pixel section,
wherein the pixel section comprises:
  a storage capacitor; and
  a fourth thin film transistor including a channel forming region overlapped with a gate electrode through a gate insulating film,
wherein the storage capacitor is formed by a light shielding film over the fourth thin film transistor, a dielectric film over the light shielding film, and a pixel electrode over the dielectric film,
wherein the pixel electrode is connected to the fourth thin film transistor through an opening formed in a spacer, and
wherein the spacer is provided on and in contact with the light shielding film.

62. An article according to claim 61, wherein the article is a portable telephone.

63. An article according to claim 61, wherein the article is a camera.

64. An article according to claim 61, wherein the article is a computer.

65. An article according to claim 61,
wherein the light shielding film comprises an element selected from a group consisting of aluminum, tantalum, and titanium, and
wherein the dielectric film comprises an oxide of the element of the light shielding film.

66. An article according to claim 61 further comprising:
a first interlayer insulating film on the entire surface of the gate insulating film and the gate electrode,
a passivation film on the first interlayer insulating film, and
a second interlayer insulating film on the passivation film,
wherein the light shielding film is provided on the second interlayer insulating film.

67. An article according to claim 61,
wherein the light shielding film comprises an element selected from a group consisting of aluminum, tantalum, and titanium.

68. An article according to claim 67,
wherein the dielectric film comprises an oxide of the element of the light shielding film.

* * * * *